United States Patent
Lu

(10) Patent No.: US 9,312,332 B2
(45) Date of Patent: Apr. 12, 2016

(54) SEMICONDUCTOR DEVICE AND METHOD FOR MANUFACTURING THE SAME

(71) Applicant: Fuji Electric Co., Ltd., Kanagawa (JP)

(72) Inventor: Hong-fei Lu, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/737,314

(22) Filed: Jun. 11, 2015

(65) Prior Publication Data
US 2016/0020276 A1 Jan. 21, 2016

(30) Foreign Application Priority Data
Jul. 15, 2014 (JP) .................................. 2014-145469

(51) Int. Cl.
| | |
|---|---|
| *H01L 21/00* | (2006.01) |
| *H01L 29/00* | (2006.01) |
| *H01L 29/06* | (2006.01) |

(Continued)

(52) U.S. Cl.
CPC ...... *H01L 29/0653* (2013.01); *H01L 21/76224* (2013.01); *H01L 29/16* (2013.01); *H01L 29/1608* (2013.01); *H01L 29/2003* (2013.01); *H01L 29/36* (2013.01)

(58) Field of Classification Search
CPC ............ H01L 29/0653; H01L 29/2003; H01L 29/1608; H01L 29/16; H01L 29/36; H01L 21/76224; H01L 21/76852; H01L 21/77
See application file for complete search history.

(56) References Cited

U.S. PATENT DOCUMENTS

| | | | | |
|---|---|---|---|---|
| 5,682,057 A | * | 10/1997 | Kuriyama | ............ H01H 37/761 |
| | | | | 257/467 |
| 6,238,980 B1 | * | 5/2001 | Ueno | ................ H01L 29/66068 |
| | | | | 257/E21.066 |

(Continued)

FOREIGN PATENT DOCUMENTS

| | | |
|---|---|---|
| JP | H11-087698 A | 3/1999 |
| JP | 2006-120807 A | 5/2006 |

(Continued)

OTHER PUBLICATIONS

H. Mahfoz-Kotb et al., "Feasibility Study of a Junction Termination Using Deep Trench Isolation Technique for the Realization of DJ-SJMOSFETs", Proceedings of the 20th International Symposium on Power Semiconductor Devices and IC's, Orlando, FL., IEEE May 18, 2008-May 22, 2008, pp. 303-306.

*Primary Examiner* — Nikolay Yushin
(74) *Attorney, Agent, or Firm* — Chen Yoshimura LLP

(57) ABSTRACT

A semiconductor device includes a first semiconductor region of a second conductivity type selectively formed in the main surface of the semiconductor substrate of a first conductivity type so as to be between a front surface structure of a first semiconductor element and a front surface structure of a second semiconductor element and so as to surround the front surface structure of the first semiconductor element and the front surface structure of the second semiconductor element; a second semiconductor region of the first conductivity type in the main surface of the semiconductor substrate outside the first semiconductor region and separated therefrom; and at least one trench filled with an insulating layer in the first semiconductor region between the first semiconductor element and the second semiconductor element, forming an isolation structure isolating the front surface structure of the first semiconductor element from the front surface structure of the second semiconductor element.

17 Claims, 23 Drawing Sheets

(51) Int. Cl.
*H01L 21/762* (2006.01)
*H01L 29/16* (2006.01)
*H01L 29/20* (2006.01)
*H01L 29/36* (2006.01)

(56) References Cited

U.S. PATENT DOCUMENTS

| | | | |
|---|---|---|---|
| 7,250,672 B2* | 7/2007 | Pavier | H01L 23/49562 257/676 |
| 7,868,432 B2* | 1/2011 | Lee | H01L 23/3107 257/666 |
| 7,880,280 B2* | 2/2011 | Otremba | H01L 23/49524 257/666 |
| 2004/0070047 A1 | 4/2004 | Majumdar et al. | |
| 2006/0118818 A1* | 6/2006 | Shimoida | H01L 29/0834 257/183 |
| 2008/0143421 A1* | 6/2008 | Yanagihara | H01L 29/2003 327/427 |
| 2009/0179265 A1 | 7/2009 | Harnden et al. | |
| 2010/0230747 A1* | 9/2010 | Barletta | H01L 29/42368 257/334 |
| 2011/0297964 A1 | 12/2011 | Miura | |
| 2012/0049274 A1* | 3/2012 | Elattari | H01L 21/743 257/330 |
| 2013/0069109 A1 | 3/2013 | Matsuda et al. | |

FOREIGN PATENT DOCUMENTS

| | | |
|---|---|---|
| JP | 2008-270681 A | 11/2008 |
| JP | 2009-131144 A | 6/2009 |
| JP | 2011-254387 A | 12/2011 |
| JP | 2013-080893 A | 5/2013 |
| JP | 5204503 B2 | 6/2013 |
| WO | 02/097888 A1 | 12/2002 |

* cited by examiner

SEMICONDUCTOR DEVICE AND METHOD FOR MANUFACTURING THE SAME

BACKGROUND OF THE INVENTION

1. Technical Field

The present invention relates to a semiconductor device and a method for manufacturing the semiconductor device.

2. Background Art

Silicon carbide (SiC) semiconductors have several advantages over traditional silicon (Si) semiconductors such as a wider band gap, greater dielectric breakdown field strength, and higher thermal conductivity. Furthermore, silicon carbide semiconductors have sufficiently high bulk mobility (carrier mobility), and like silicon semiconductors, the surface of a silicon carbide semiconductor can be thermally oxidized to create an insulating layer. For these reasons, in recent years silicon carbide has seen increased use as the semiconductor material of choice in the manufacture of power semiconductor devices, where silicon carbide semiconductors can provide performance that exceeds the limits of traditional silicon semiconductors.

Among the various types of power semiconductor devices, insulated-gate type semiconductor devices such as metal-oxide-semiconductor field-effect transistors (MOSFETs) and insulated-gate bipolar transistors (IGBTs) have seen a particularly large amount of research and development in recent years. For example, MOSFET devices have become one of the most commonly used types of devices in the 10 kV and lower withstand voltage class, and IGBT devices have recently become more prominent in withstand voltage classes beyond 10 kV.

Bidirectional devices that have bidirectional withstand voltage properties have become indispensable in applications in which the flow of power must be controlled in both directions. Common applications of bidirectional devices include protection circuits in lithium-ion batteries, multilevel power converters, and failure isolation elements that are used in power transmission systems to isolate points of failure from the rest of the system. Bidirectional MOSFET devices typically have circuit configurations such as those shown in FIGS. 23 and 24. FIGS. 23 and 24 are circuit diagrams illustrating common circuit configurations of bidirectional devices. As shown in FIGS. 23 and 24, the MOSFET devices 101a and 101b are three-terminal devices that include source terminals 102a and 102b, drain terminals 103a and 103b, and gate terminals 104a and 104b, respectively.

In a bidirectional device, the drain terminals 103a and 103b or the source terminals 102a and 102b of two semiconductor devices such as the MOSFET devices 101a and 101b are electrically connected (see Patent Documents 1 and 2, for example). FIG. 23 depicts a bidirectional device 111 in which two MOSFET devices 101a and 101b share a common drain terminal 103. FIG. 24 depicts a bidirectional device in which two MOSFET devices 101a and 101b share a common source terminal 102. The reference characters 104a and 104b indicate gate terminals. The reference characters 105a and 105b indicate built-in body diodes in the MOSFET devices 101a and 101b.

Next, an example of a multilevel power converter will be described as a usage example of the bidirectional device 111 shown in FIG. 23. FIG. 25 is a circuit diagram illustrating the circuit configuration of a multilevel power converter. The circuit configuration shown in FIG. 25 is one phase of a three-level inverter. As shown in FIG. 25, the bidirectional device 111 is connected to a midpoint potential point (an output terminal Out) between two main switch IGBT devices 112 and 113 and to a neutral point N created by dividing a bus voltage Vbus between two DC-link capacitors 110. The bidirectional device 111 serves as a neutral point clamp that clamps the midpoint potential between the two IGBT devices 112 and 113. AC power is supplied to an inductive load 114 from the midpoint potential point between the two IGBT devices 112 and 113.

In the bidirectional device 111, the MOSFET devices 101a and 101b are typically formed on two separate semiconductor substrates (semiconductor chips) which are then mounted on an insulating substrate. FIG. 26 is a plan view illustrating an example configuration inside a conventional semiconductor package case. As shown in FIG. 26, the MOSFET devices 101a and 101b are formed on separate semiconductor chips. The rear surface electrodes (drain electrodes) of the MOSFET devices 101a and 101b are each connected to a copper (Cu) wiring layer formed on the surface of a ceramic substrate 125 (an insulating substrate) such as a direct bonded copper (DBC) substrate. This copper wiring layer is connected to a drain pad 123 via a wire and serves as a common drain terminal 103 for the MOSFET devices 101a and 101b.

The front surface electrodes (source terminals 102a and 102b) of the MOSFET devices 101a and 101b are connected via wires to source pads 122a and 122b, respectively, mounted on the surface of the insulating substrate 125. Moreover, the front surface electrodes of the MOSFET devices 101a and 101b are connected via wires to auxiliary source terminals 126a and 126b, respectively, mounted on the surface of the insulating substrate 125, for example. The auxiliary source terminals 126a and 126b serve as source potential connection terminals when a gate signal is applied. The gate electrodes (gate terminals 104a and 104b) of the MOSFET devices 101a and 101b are connected via wires to gate pads 124a and 124b, respectively, mounted on the surface of the insulating substrate 125.

Moreover, forming both MOSFET devices 101a and 101b monolithically on the same semiconductor chip is also a well-known technique. Patent Document 1 discloses a semiconductor device package in which two MOSFET devices that together form a bidirectional switch are formed on a single semiconductor chip which is then mounted on an insulating substrate and housed within a case. FIG. 27 is a plan view illustrating a configuration of a conventional semiconductor package from the top side (that is, the side on which the case lid is arranged). FIG. 28 is a cross-sectional view of a cross section taken along line AA-AA' in FIG. 27. FIGS. 27 and 28 correspond to FIGS. 6A and 6B in Patent Document 1, respectively.

As shown in FIGS. 27 and 28, the MOSFET devices 101a and 101b are both formed on a single semiconductor chip 131 (a silicon substrate) which is then housed in a case 130. The source terminals of the MOSFET devices 101a and 101b (not shown in the figures) are connected, respectively, to external connection terminals 132a and 132b that are drawn out to the exterior of the case 130 and left exposed. The semiconductor chip 131 in which the MOSFET devices 101a and 101b are formed provides a common drain resistance 133. A rear surface electrode 134 is formed on the rear surface of the silicon substrate 131 in order to reduce this drain resistance 133.

Moreover, it can be assumed that the MOSFET devices used to form the bidirectional switch in Patent Document 1 have a low withstand voltage because the bidirectional switch is mounted in a dual flat no-lead (DFN) package. Moreover, the structure used between the MOSFET devices 101a and 101b that are formed on the same substrate is not described in detail in Patent Document 1. If the MOSFET devices 101a and 101b had a high withstand voltage, an edge termination structure would be required to maintain a withstand voltage between the two MOSFET devices 101a and 101b. In silicon carbide semiconductor devices, for example, a junction termination extension (JTE) structure is typically used for the edge termination structure.

Next, a JTE structure will be described. FIG. 29 is a cross-sectional view of an example edge termination structure in a conventional semiconductor device. As shown in FIG. 29, an n⁻ drift layer 142 is formed on the front surface of an n⁺ semiconductor substrate 141 (a semiconductor chip) that serves as an n⁺ drain layer. A p⁺ well region 143 that is part of the semiconductor structure is formed within the active region in the surface layer of the front surface of the n⁻ drift layer 142 (that is, the surface opposite to the n⁺ semiconductor substrate 141 side). The p⁺ well region 143 and the n⁻ drift layer 142 form the primary junction of the device. In the off state, the depletion layer 152 expands outwards from the p-n junction between the p⁺ well region 143 and the n⁻ drift layer 142. Here, the term active region refers to the region through which current flows when the device is in the on state.

Moreover, a p-type JTE region 144 is formed in the surface layer on the front surface of the n⁻ drift layer 142 (that is, the surface opposite to the n⁺ semiconductor substrate 141 side). The JTE region 144 contacts the chip edge side of the p⁺ well region 143 and surrounds the periphery of the active region. The p-type JTE region 144 has a lower concentration of impurities than the p⁺ well region 143, and the JTE structure is formed by arranging the p-type JTE region 144 at the termination of the p-n junction between the p⁺ well region 143 and the n⁻ drift layer 142. Moreover, an n⁺ channel-stop region 145 is formed in the surface layer on the front surface of the n⁻ drift layer 142 (that is, the surface opposite to the n⁺ semiconductor substrate 141 side). The channel-stop region 145 is separated from the p-type JTE region 144 and positioned nearer to the chip edge than the JTE region 144. The edge termination structure includes everything from the boundary between the p⁺ well region 143 and the p-type JTE region 144 to the edge of the chip.

An interlayer insulating film 146 is formed on the surfaces of the p⁺ well region 143, the p-type JTE region 144, and the n⁺ channel-stop region 145 from the edge termination structure side edge of the p⁺ well region 143 to the edge of the chip. A source electrode 147 is arranged in contact with the p⁺ well region 143. A passivation film 151 is formed on the surfaces of the source electrode 147 and the interlayer insulating film 146 from the edge termination structure side edge of the source electrode 147 to the edge of the chip. A drain electrode 148 is formed on the rear surface of the n⁺ semiconductor substrate 141. A scribe region 149 is formed on both edges of the chip. A rough surface 150b is formed within the scribe region 149 on each edge face 150a of the chip when the overall semiconductor wafer is diced into individual chips.

FIG. 30 illustrates another example of an edge termination structure. FIG. 30 is a cross-sectional view of another example of an edge termination structure in a conventional semiconductor device. As shown in FIG. 30, when forming the MOSFET devices 101a and 101b on the same semiconductor substrate, an n⁺ channel-stop region 145 may be arranged in the center, with the MOSFET devices 101a and 101b arranged symmetrically on either side thereof. This makes it possible to reduce the overall chip size because there is no need to provide a scribe region 149 between the adjacent edges of the two semiconductor chips for the MOSFET devices 101a and 101b to facilitate later mounting those two chips separately on the insulating substrate 125 (see FIGS. 26 and 29).

Therefore, when mounting the single monolithic semiconductor chip that contains the MOSFET devices 101a and 101b on an insulating substrate, the area of the copper wiring layer on the insulating substrate 125 that serves as the common drain terminal 103 for the MOSFET devices 101a and 101b can be made smaller than when mounting two separate semiconductor chips for the MOSFET devices 101a and 101b on the insulating substrate 125. In FIG. 30, the letters a and b are appended to each p⁺ well region 143, each p-type JTE region 144, each source electrode 147, and each depletion layer 152 that extends from the primary device junction in order to indicate to which MOSFET device (101a or 101b) each portion belongs.

Moreover, Patent Document 3 discloses a MOSFET edge termination structure in which a plurality of trenches are formed on either side of the primary junction of the MOSFET device and p⁺ layers or Schottky contacts are formed at the bottom of each trench. Next, the edge termination structure disclosed in Patent Document 3 will be described. FIG. 31 is a cross-sectional view of another example of an edge termination structure in a conventional semiconductor device. FIG. 31 corresponds to FIG. 2 in Patent Document 3. As shown in FIG. 31, an n⁻ drift layer 142 is formed on the front surface of an n⁺ semiconductor substrate 141 that serves as an n⁺ drain layer.

A p-type well region 153 is formed in the active region in the surface layer of the front surface of the n⁻ drift layer 142 (that is, the surface opposite to the n⁺ semiconductor substrate 141 side). A trench (an active region trench) 154 is formed. The active region trench 154 goes through the entire p-type well region 153 in the substrate thickness direction and extends into the n⁻ drift layer 142. The active region trench 154 divides the p-type well region 153 into a plurality of regions. Within the active region trench 154, a gate insulation film 155 and a gate electrode 156 are formed. N⁺ source regions 157 are provided selectively in the p-type well region 153 and are arranged in contact with the gate insulation film 155 formed on the sidewalls of the active region trench 154.

Moreover, a p-type termination region 163 is formed in the edge termination structure region in the surface layer of the front surface of the n⁻ drift layer 142 (that is, the surface opposite to the n⁺ semiconductor substrate 141 side). Trenches (termination region trenches) 164 are formed. The termination region trenches 164 go through the entire p-type termination region 163 in the substrate thickness direction and extend into the n⁻ drift layer 142. The termination region trenches 164 divide the p-type termination region 163 into a plurality of p-type regions. The portions of the p-type termination region 163 between the termination region trenches 164 function as p-type JTE regions 162.

P⁺ regions 161 are formed on the exposed surfaces of the n⁻ drift layer 142 at the bottoms of the termination region trenches 164. An insulating film 165 is formed along the inner walls of the termination region trenches 164. The interior regions of the termination region trenches 164 are not completely filled by the insulating film 165. An interlayer insulating film 158 is formed covering the gate electrode 156, the p-type JTE regions 162, and the p-type termination region 163. A source electrode 159 is arranged in contact with the n⁺ source regions 157 and the p-type well region 153 via contact holes that go through the interlayer insulating film 158 in the thickness direction thereof. The source electrode 159 is electrically insulated from the gate electrodes 156 by the interlayer insulating film 158. A drain electrode 160 is formed on the rear surface of the n⁺ semiconductor substrate 141.

In the semiconductor devices shown in FIGS. 30 and 31, the withstand voltage of the front surface of the device is divided between the p-type JTE regions 144 and the portions of the n⁻ drift layer 142 between the p-type JTE regions 144 and the n⁺ channel-stop region 145.

Moreover, other types of edge termination structures for MOSFET devices such as the following edge termination structure have also been proposed. FIG. 32 is a cross-sectional view of another example of an edge termination structure in a conventional semiconductor device. There are of five primary differences between the semiconductor device shown in FIG. 32 and the semiconductor device shown in FIG. 31. First, a p-type well region 153 is formed over the entire front surface of the n⁻ drift layer 142 (that is, the surface opposite to the n⁺ semiconductor substrate 141 side). Here, the p-type well region 153 also serves as a p-type termination region and as a p-type JTE region. Second, termination region trenches 164 that are formed as part of the edge termination structure are completely filled by an insulating film 166. Third, a p⁺ region 161 is only formed at the bottom of the termination region trench 164 that is closest to the active region.

Fourth, p⁺ contact regions 167 are formed over the entire front surface of the p-type well region 153 (that is, the source electrode 159-side surface) from the active region to the chip edge side of the edge termination structure. Fifth, shield electrodes 168 that cover the portions of the p-type well region 153 between the termination region trenches 164 are formed. The shield electrodes 168 contact the respective p⁺ contact regions 167 via contact holes that go through an interlayer insulating film 158 and a gate insulation film 155 down to the p⁺ contact regions 167. The source electrode 159 contacts the p⁺ contact region 167 in the active region (see Patent Document 4). FIG. 32 corresponds to FIG. 2 in Patent Document 4.

Non-Patent Document 1 discloses another example of a MOSFET edge termination structure. The semiconductor device disclosed in Non-Patent Document 1 has a super junction structure in which the drift layer includes n-type regions and p-type regions that have a high concentration of impurities and that are alternately arranged parallel to the main substrate surface to form a parallel p-n layer. This type of semiconductor device is known as a super junction semiconductor device. Next, the edge termination structure of the super junction semiconductor device disclosed in Non-Patent Document 1 will be described. FIG. 33 is a cross-sectional view of another example of an edge termination structure in a conventional super junction semiconductor device. FIG. 33 corresponds to FIG. 3 in Non-Patent Document 1. As shown in FIG. 33, an n⁻ drift layer 172 is formed on the front surface of an n⁺ semiconductor substrate 171 that serves as an n⁺ drain layer.

P-type well regions 173 are formed in the active region in the surface layer of the front surface of the n⁻ drift layer 172 (that is, the surface opposite to the n⁺ semiconductor substrate 171 side). An active region trench 174a is formed in the active region. The active region trench 174a goes through the entire p-type well region 173 in the thickness direction thereof and extends into the n⁻ drift layer 172. Moreover, a termination region trench 174b is formed in the boundary region between the active region and the edge termination structure. The termination region trench 174b goes through the entire p-type well region 173 in the thickness direction thereof and extends into the n⁻ drift layer 172. The active region trench 174a and the termination region trench 174b go through more than half of the thickness of the n⁻ drift layer 172 and reach down to near the interface between the n⁺ semiconductor substrate 171 and the n⁻ drift layer 172.

P-type regions 175 are formed on the exposed surfaces of the n⁻ drift layer 172 on the interior walls of the active region trench 174a and the termination region trench 174b. The n⁻ drift layer 172 and the p-type regions 175 form a charge balance structure. The interior regions of the active region trench 174a and the termination region trench 174b are filled by an insulating film 176. N⁺ source regions 177 are provided selectively in the p-type well regions 173. On the front surfaces of the portions of the p-type well regions 173 between the n⁻ drift layer 172 and the n⁺ source regions 177, a gate insulation film 178 and a gate electrode 179 are formed.

An interlayer insulating film 180 is formed covering the gate electrode 179. A source electrode 181 is arranged in contact with the n⁺ source regions 177 and the p-type well region 173 via contact holes that go through the interlayer insulating film 180 in the thickness direction thereof. The source electrode 181 is electrically insulated from the gate electrode 179 by the interlayer insulating film 180. Moreover, the source electrode 181 extends over a portion of an interlayer insulating film 180 that covers the termination region trench 174b. The source electrode 181 thereby covers a portion of the termination region trench 174b, with the interlayer insulating film 180 disposed therebetween. A drain electrode 182 is formed on the rear surface of the n⁺ semiconductor substrate 171.

Patent Document 5 discloses another example of a MOSFET edge termination structure. Patent Document 5 discloses a structure in which a semiconductor layer having a first conductivity type includes a device portion and a device termination portion. A trench structure is formed in the surface of the device termination portion, and the trench is filled with an insulating material.

Patent Document 6 discloses another example of a MOSFET edge termination structure. In Patent Document 6, a trench is formed in an n-type semiconductor substrate and filled with an insulating film. A recess deeper than the thickness of a p-type well region is formed in this insulating film, and a field plate electrode is formed within the recess.

Patent Document 7 discloses a semiconductor device in which vertical silicon carbide MOSFET devices are arranged on the same semiconductor substrate. The semiconductor device disclosed in Patent Document 7 includes: a silicon carbide substrate having a front surface and a rear surface; an isolation region formed all the way from the front surface to the rear surface of the substrate; and first and second vertical MOSFET devices arranged on either side of the isolation region.

RELATED ART DOCUMENTS

Patent Documents

Patent Document 1: Japanese Patent No. 5204503
Patent Document 2: Japanese Patent Application Laid-Open Publication No. 2011-254387
Patent Document 3: Japanese Patent Application Laid-Open Publication No. H11-087698
Patent Document 4: Japanese Patent Application Laid-Open Publication No. 2008-270681
Patent Document 5: Japanese Patent Application Laid-Open Publication No. 2013-080893
Patent Document 6: Japanese Patent Application Laid-Open Publication No. 2006-120807
Patent Document 7: WO 2002/097888

Non-Patent Document

Non-Patent Document 1: H. Mahfoz-Kotb et al. Feasibility Study of a Junction Termination Using Deep Trench Isolation Technique for the Realization of DJ-SJMOSFETs. Proceedings of the 20th International Symposium on Power Semiconductor Devices and IC's, Orlando, Fla. IEEE May 18, 2008-May 22, 2008, p. 303-306.

SUMMARY OF THE INVENTION

However, when the MOSFET devices 101a and 101b are formed monolithically on the same semiconductor substrate (semiconductor chip) as shown in FIG. 30, the length (width) L11 of the isolation structure that electrically isolates the MOSFET devices 101a and 101b from one another is approximately two times the length L10 of the edge termination structure (JTE structure) of the semiconductor chip on which separate chips for the MOSFET devices 101a and 101b are mounted in the configuration shown in FIG. 26. Here, the term isolation structure refers to the portion sandwiched between the active regions in which the MOSFET devices 101a and 101b are formed. When a single monolithic semiconductor chip in which the MOSFET devices 101a and 101b are formed is mounted on an insulating substrate 125, the area of a copper wiring layer on the front surface of the insulating substrate 125 (a wiring layer that serves as a common drain terminal 103 for the MOSFET devices 101a and 101b) can be reduced. However, parasitic capacitance C forms between this copper wiring layer, the ceramic layer of the insulating substrate 125, and the copper wiring layer on the rear surface of the insulating substrate 125.

When arranging this type of module (that is, the insulating substrate 125 on which the semiconductor chip is mounted) on a heat sink in a multilevel power converter such as the one shown in FIG. 25, for example, the DC-link capacitor 110 may receive common-mode noise or other undesired interference effects from the wires and convert that common-mode noise into normal-mode noise. Here, the term common-mode noise refers to noise generated between the power supply line and the ground GND. The term normal-mode noise refers to noise in the main lines. Because silicon carbide MOSFET devices are typically operated at high speed, the change in voltage per unit time (dV/dt) in the drain terminal 103 is large, and it is desirable to further reduce the parasitic capacitance C in the insulating substrate 25. Moreover, further miniaturization can be achieved by mounting a bidirectional device that includes the MOSFET devices 101a and 101b formed monolithically on the same semiconductor substrate in a discrete transistor outline (TO) package.

Furthermore, by removing the regions required for dicing and arranging two instances of the semiconductor devices shown in FIGS. 31 and 32 symmetrically, a bidirectional device that exhibits bidirectional withstand voltage properties can be obtained. In the semiconductor device shown in FIG. 31, however, the withstand voltage is only divided between the portion of the n⁻ drift layer 142 between the p-type termination region 163 and the p⁺ well region 161, and therefore the termination structure includes an unnecessary portion which bears none of the withstand voltage (the p-type termination region 163). The semiconductor devices shown in FIGS. 31 and 32 both suffer from this same problem. Moreover, the electrostatic potential distribution shown in FIG. 9 of Patent Document 4 illustrates the fact that in the semiconductor device shown in FIG. 32, the p-type base region 153 near the interface between the active region and the edge termination structure bears none of the withstand voltage.

Furthermore, by removing the regions required for dicing and arranging two instances of the semiconductor device shown in FIG. 33 symmetrically, a bidirectional device that exhibits bidirectional withstand voltage properties can be obtained. In the semiconductor device shown in FIG. 33, however, the termination region trench 174b would have to be at least 90 µm deep and at least 75 µm wide to achieve a semiconductor device in the 1200V withstand voltage class, and such a device would have extremely poor manufacturability.

The present invention was made in view of such problems in the conventional technologies described above and aims to provide a semiconductor device and a method for manufacturing the semiconductor device in which the length (width) of an isolation structure that electrically isolates two semiconductor elements formed monolithically on the same semiconductor substrate can be shortened, thereby facilitating miniaturization of the device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate of a first conductivity type; a first semiconductor element having a front surface structure in a main surface of the semiconductor substrate; a second semiconductor element having a front surface structure in the main surface of the semiconductor substrate, the front surface structure of the second semiconductor element being separated from the front surface structure of the first semiconductor element; a rear surface electrode for the first and second semiconductor elements; a first semiconductor region of a second conductivity type selectively formed in the main surface of the semiconductor substrate so as to be between the front surface structure of the first semiconductor element and the front surface structure of the second semiconductor element and so as to surround the front surface structure of the first semiconductor element and the front surface structure of the second semiconductor element; a second semiconductor region of the first conductivity type formed in the main surface of the semiconductor substrate outside the first semiconductor region and separated therefrom; and at least one trench filled with an insulating layer in the first semiconductor region between the first semiconductor element and the second semiconductor element, respective ends of the at least one trench extending parallel to the main surface out of the first semiconductor region into the second semiconductor region so as to divide the first semiconductor region into a first semiconductor element side and a second semiconductor element side, thereby forming an isolation structure that includes the first semiconductor region between the first semiconductor element and the second semiconductor element and the at least one trench filled with the insulating layer, electrically isolating the front surface structure of the first semiconductor element from the front surface structure of the second semiconductor element.

Furthermore, in order to solve the abovementioned problems and achieve the objectives of the present invention, in one aspect, the present disclosure provides a semiconductor device, including: a semiconductor substrate of a first conductivity type; a first semiconductor element having a front surface structure in a main surface of the semiconductor substrate; a second semiconductor element having a front surface structure in the main surface of the semiconductor substrate, the front surface structure of the second semiconductor element being separated from the front surface structure of the first semiconductor element; a rear surface electrode for the first and second semiconductor elements; a first semiconductor region of a second conductivity type selectively formed in the main surface of the semiconductor substrate so as to be between the front surface structure of the first semiconductor element and the front surface structure of the second semiconductor element and so as to surround the front surface structure of the first semiconductor element and the front surface structure of the second semiconductor element; a second semiconductor region of the second conductivity type formed in the main surface of the semiconductor substrate outside the first semiconductor region and in contact therewith; a first trench filled with an insulating layer in the first semiconductor region, surrounding the front surface structure of the first semiconductor element; a second trench filled with an insulating layer in the first semiconductor region, surrounding the front surface structure of the second semiconductor element, the second trench being separated from the first trench; a third trench filled with an insulating layer in the first semiconductor region, separated from the first and second trenches and surrounding the first and second trenches so as to divide the first semiconductor region into an inner side and an outer side, thereby forming an isolation structure that includes the first and second trenches and the first semiconductor region between the first semiconductor element and the second semiconductor element, electrically isolating the front surface structure of the first semiconductor element from the front surface structure of the second semiconductor element.

Moreover, in at least one aspect of the present semiconductor device, a width of a portion where the first and third trenches are closest to one another may be equal to a width of a portion where the first and second trenches are closest to one another.

Furthermore, in at least one aspect of the present semiconductor device, a width of a portion where the second and third trenches are closest to one another may be equal to a width of a portion where the first and second trenches are closest to one another.

In addition, in at least one aspect of the present semiconductor device, a portion of the first semiconductor region that is between the first semiconductor element and the second semiconductor element may have a width that withstands at least 60% of a guaranteed maximum breakdown voltage, the portion of the first semiconductor region being completely depleted when the breakdown voltage is reached.

Moreover, in at least one aspect of the present semiconductor device, portions of the first semiconductor region located between outer sides of the front surface structure of the first semiconductor element and the second semiconductor region and located between outer sides of the front surface structure of the second semiconductor element and the second semiconductor region may form termination structures.

In at least one aspect of the present semiconductor device, the front surface structure of the first semiconductor element may further include a third semiconductor region of the second conductivity type in the main surface of the semiconductor substrate, the third semiconductor region being in contact with the first semiconductor region and having a higher concentration of impurities than the first semiconductor region, and the front surface structure of the second semiconductor element may further include a fourth semiconductor region of the second conductivity type in the main surface of the semiconductor substrate, the fourth semiconductor region being in contact with the first semiconductor region and having a higher concentration of impurities than the first semiconductor region, and the semiconductor device may further include: an interlayer insulating film formed on at least a portion of the third semiconductor region, on at least a portion of the first semiconductor region, and on at least a portion of the fourth semiconductor region; a first input electrode in contact with the third semiconductor region and an adjacent portion of the first semiconductor region, the first input electrode extending over a portion of the interlayer insulating film; a second input electrode in contact with the fourth semiconductor region and an adjacent portion of the first semiconductor region, the second input electrode extending over a portion of the interlayer insulating film; a semiconductor layer of the first conductivity type formed on another main surface of the semiconductor substrate, the semiconductor layer having a higher concentration of impurities than the semiconductor substrate; and a rear surface electrode in contact with the semiconductor layer.

Moreover, in at least one aspect of the present semiconductor device, a depth of each of the at least one trench may be greater than or equal to 1.75 μm and less than 5.0 μm.

Furthermore, in at least one aspect of the present semiconductor device, a width of each of the at least one trench may be greater than or equal to 1.8 μm and less than 6.0 μm.

In addition, in at least one aspect of the present semiconductor device, silicon carbide, gallium nitride, a gallium nitride-based compound, or silicon may be used as a semiconductor material of the semiconductor substrate.

Moreover, in at least one aspect of the present semiconductor device, a four-layer hexagonal silicon carbide single crystal may be used as a semiconductor material of the semiconductor substrate, and an impurity dosage of the first semiconductor region may be $1.1 \times 10^{13}/cm^2$ to $1.75 \times 10^{13}/cm^2$.

Moreover, in order to solve the abovementioned problems and achieve the objectives of the present invention, in one aspect, the present disclosure provides a method of manufacturing a semiconductor device, including: forming a first semiconductor element and a second semiconductor element in a semiconductor substrate of a first conductivity type, the first semiconductor element having a front surface structure in a main surface of the semiconductor substrate, the second semiconductor element having a front surface structure in the main surface of the semiconductor substrate; forming a rear surface electrode for the first and second semiconductor elements; selectively forming a first semiconductor region of a second conductivity type in the main surface of the semiconductor substrate of such that the first semiconductor region is located between the front surface structure of the first semiconductor element and the front surface structure of the second semiconductor element as well as surrounding the front surface structure of the first semiconductor element and the front surface structure of the second semiconductor element; forming a second semiconductor region of the first conductivity type in the main surface of the semiconductor substrate outside the first semiconductor region and separated therefrom; and forming at least one trench filled with an insulating layer in the first semiconductor region between the first semiconductor element and the second semiconductor element, respective ends of the at least one trench extending parallel to the main surface out of the first semiconductor region into the second semiconductor region so as to divide the first semiconductor region into a first semiconductor element side and a second semiconductor element side, thereby forming an isolation structure that includes the at least one trench filled with the insulating layer and the first semiconductor region between the first semiconductor element and the second semiconductor element, electrically isolating the front surface structure of the first semiconductor element from the front surface structure of the second semiconductor element.

In comparison with isolation structures found in conventional bidirectional devices made using the semiconductor devices shown in FIGS. 30 to 32, in at least one aspect of the present invention the length of the isolation structure can be shortened by a value equal to the combined lengths of the n$^+$ channel-stop region and the portion of the n$^-$ drift layer between the n$^+$ channel-stop region and the p-type JTE region, which are not required in the isolation structure of the present invention.

The semiconductor device and the method for manufacturing the semiconductor device of several aspects of the present invention make it possible to shorten the length (width) of an isolation structure that electrically isolates two semiconductor elements formed on the same semiconductor substrate, thereby facilitating miniaturization of the overall semiconductor device.

It is to be understood that both the foregoing general description and the following detailed description are exemplary and explanatory, and are intended to provide further explanation of the invention as claimed.

DETAILED DESCRIPTION OF EMBODIMENTS

Figure 1:
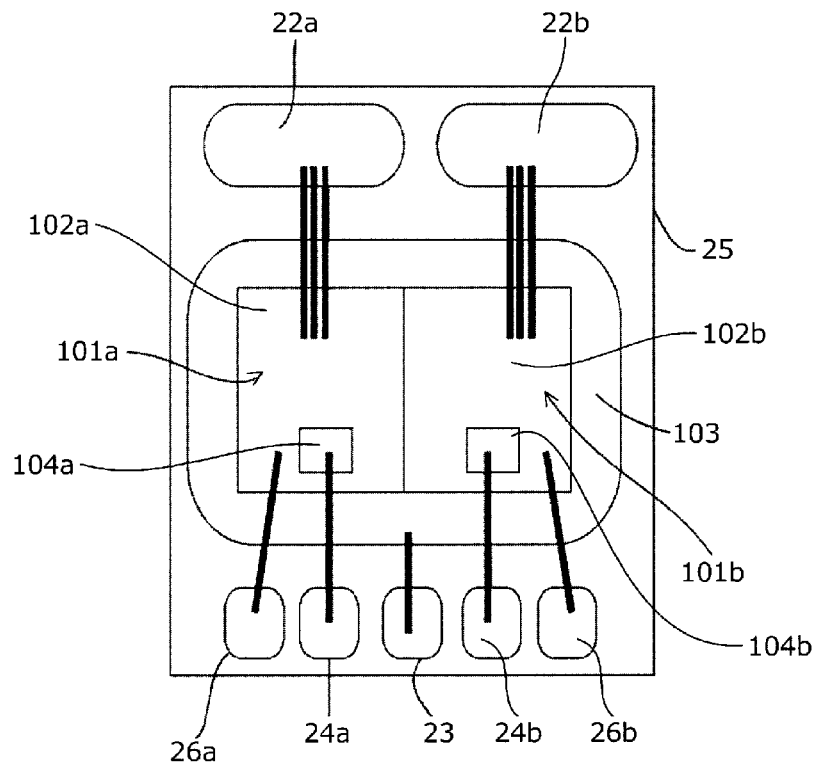
FIG. 1 is a plan view illustrating an example configuration of the interior of a package case in which a semiconductor device according to Embodiment 1 is housed.

Preferred embodiments of the semiconductor device and the method for manufacturing a semiconductor device of the present invention will be described in detail below with reference to figures. In the present specification and the attached drawings, the letters n and p are used to indicate whether the majority carriers in a layer or region are electrons or holes, respectively. Moreover, the symbols + and − are appended to the letters n and p to indicate layers or regions having a higher or lower concentration of impurities, respectively, than layers or regions not labeled with the + or − symbols. In the descriptions of the embodiments and figures, the same reference characters are used to indicate components that are the same, and duplicate descriptions of the same components are omitted. Moreover, the following notation is used for Miller indices in the present specification: the symbol − indicates a bar to be applied to the index that follows the − symbol; that is, the symbol − is inserted before an index to indicate that that index is negative.

Embodiment 1

Figure 2:
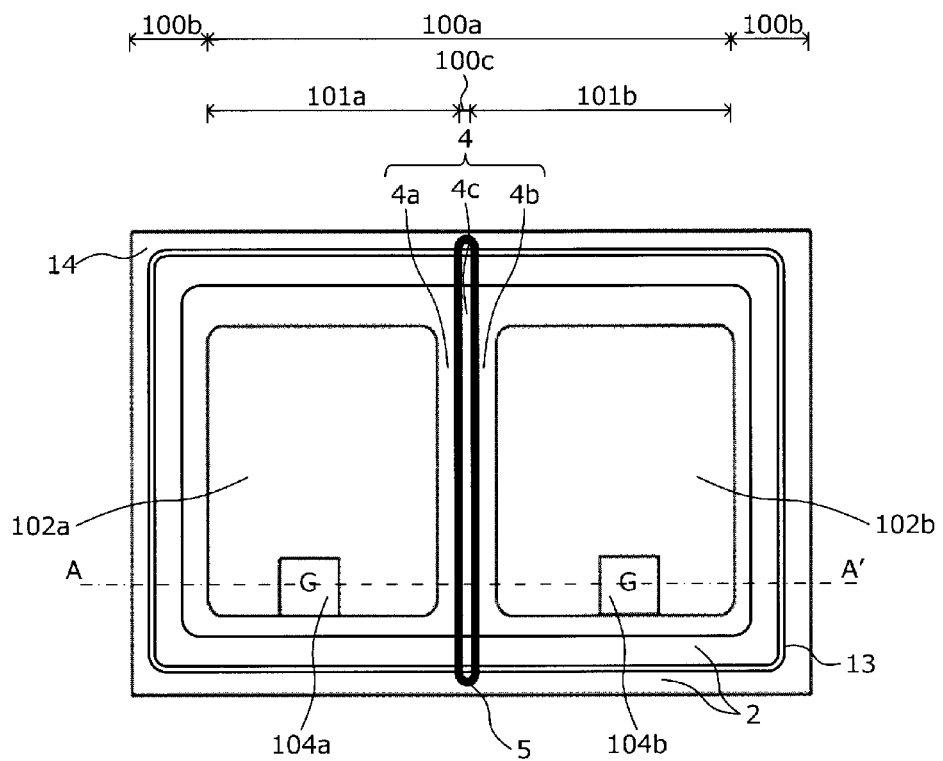
FIG. 2 is a plan view illustrating the semiconductor chip mounted on the insulating substrate in FIG. 1 from the top side (that is, the case lid side).
Figure 3:
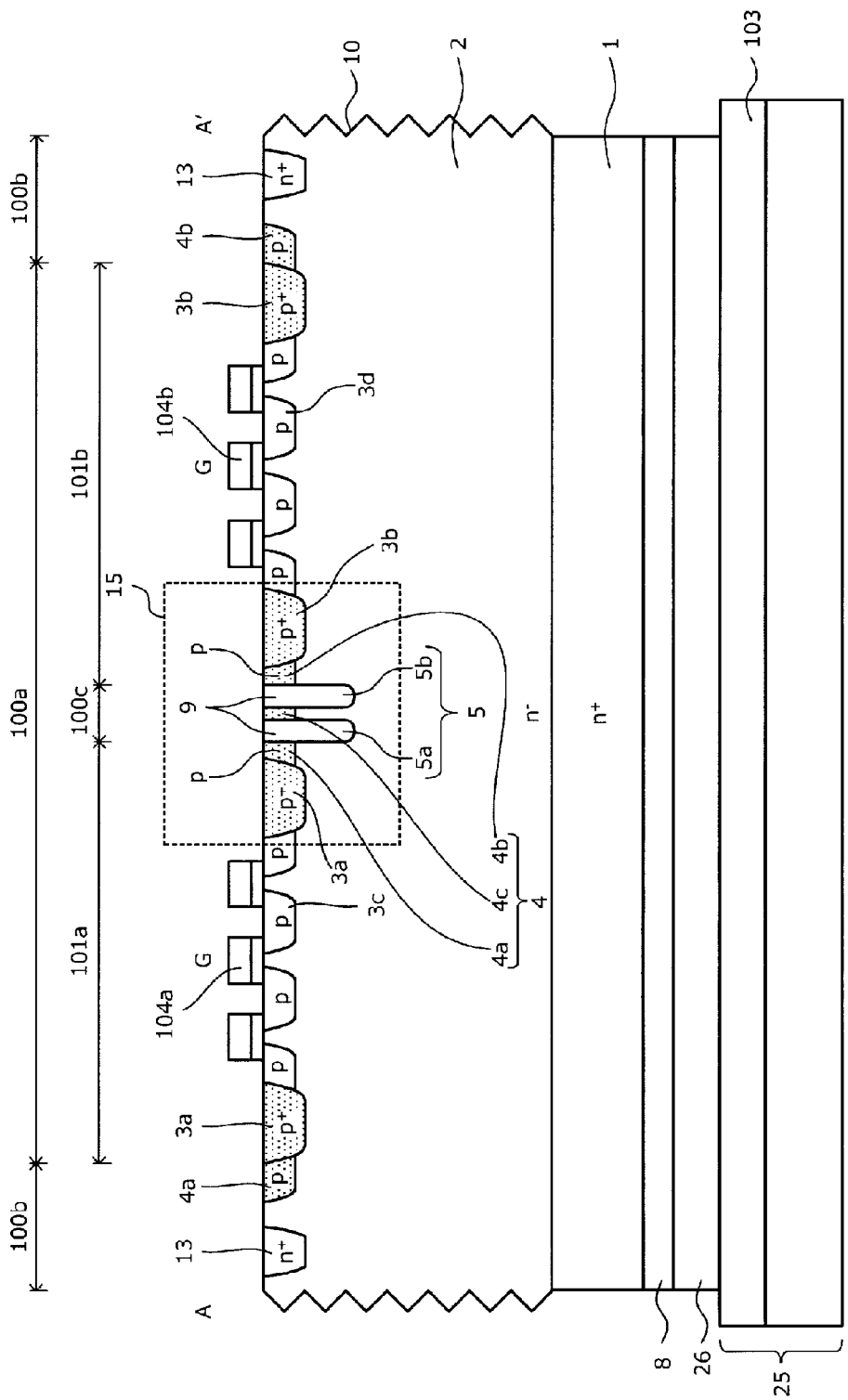
FIG. 3 is a cross-sectional view of a cross section taken along line A-A' in FIG. 2.
Figure 4:
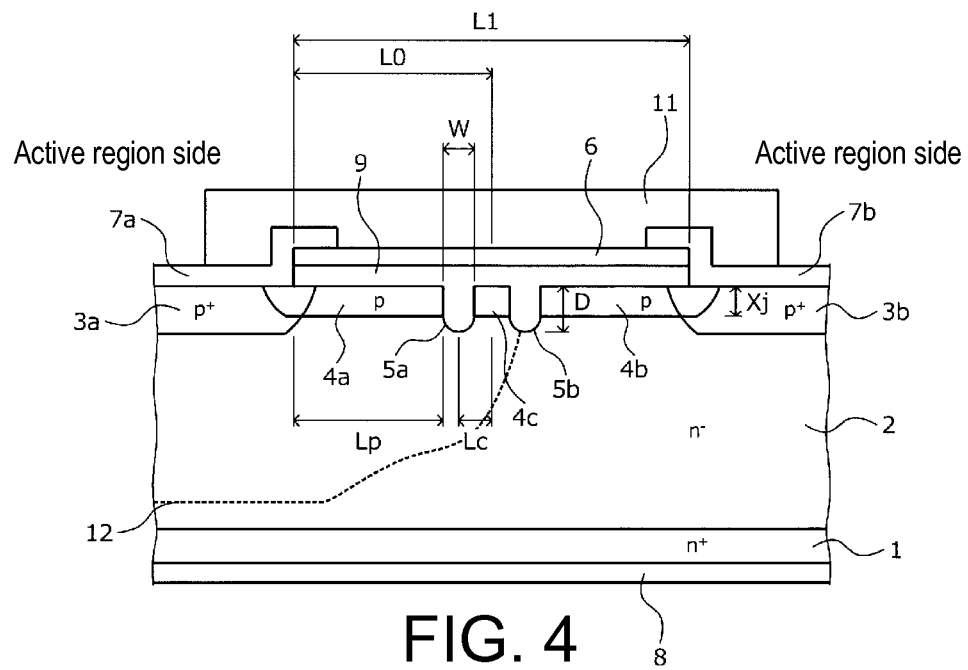
FIG. 4 is an enlarged cross-sectional view of an isolation structure that electrically isolates the two MOSFET devices shown in FIG. 3.

A silicon carbide (SiC) semiconductor device will be described below as an example of a semiconductor device according to Embodiment 1. FIG. 1 is a plan view illustrating an example configuration of the interior of a package case in which the semiconductor device according to Embodiment 1 is housed. FIG. 1 illustrates the chip mounting block in the package, on which discrete semiconductor elements or modules that include several semiconductor elements are mounted. FIG. 2 is a plan view illustrating the semiconductor chip mounted on the insulating substrate in FIG. 1 from the top side (that is, the case lid side). FIG. 3 is a cross-sectional view of a cross section taken along line A-A' in FIG. 2. FIG. 4 is an enlarged cross-sectional view of an isolation structure that electrically isolates the two MOSFET devices shown in FIG. 3.

Figure 23:
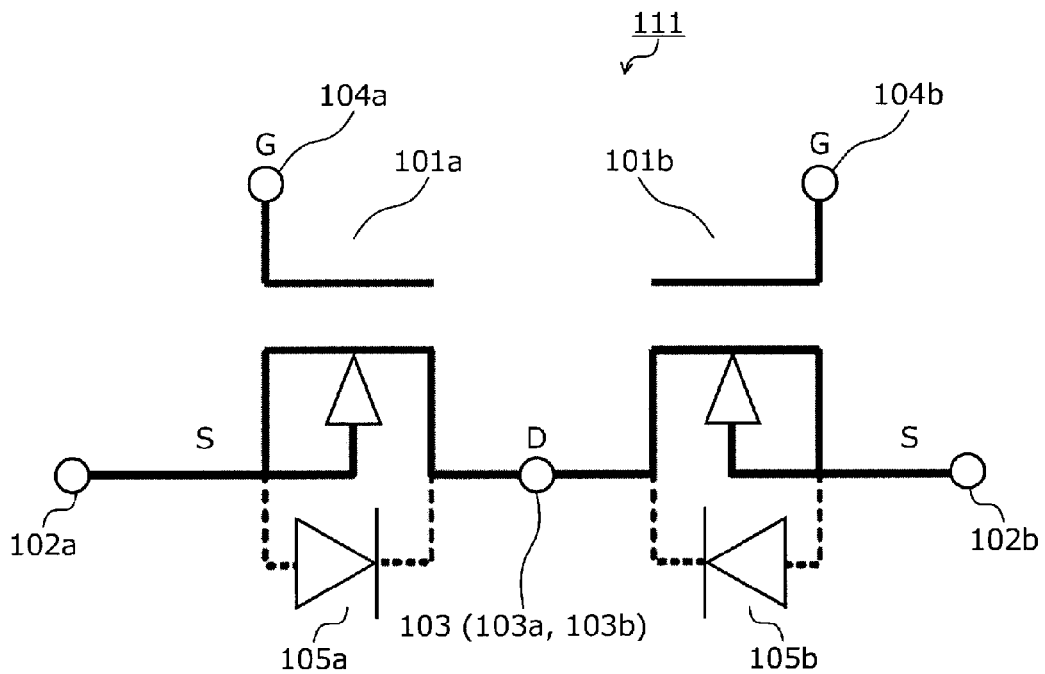
FIG. 23 is a circuit diagram illustrating a common circuit configuration of a bidirectional device.
Figure 24:
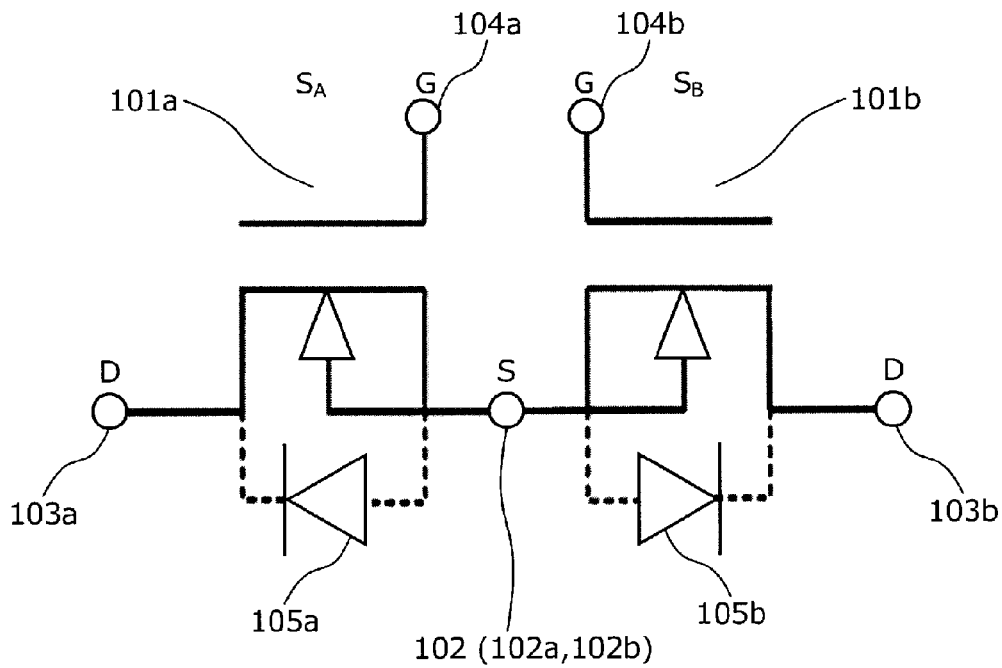
FIG. 24 is a circuit diagram illustrating a common circuit configuration of a bidirectional device.
Figure 25:
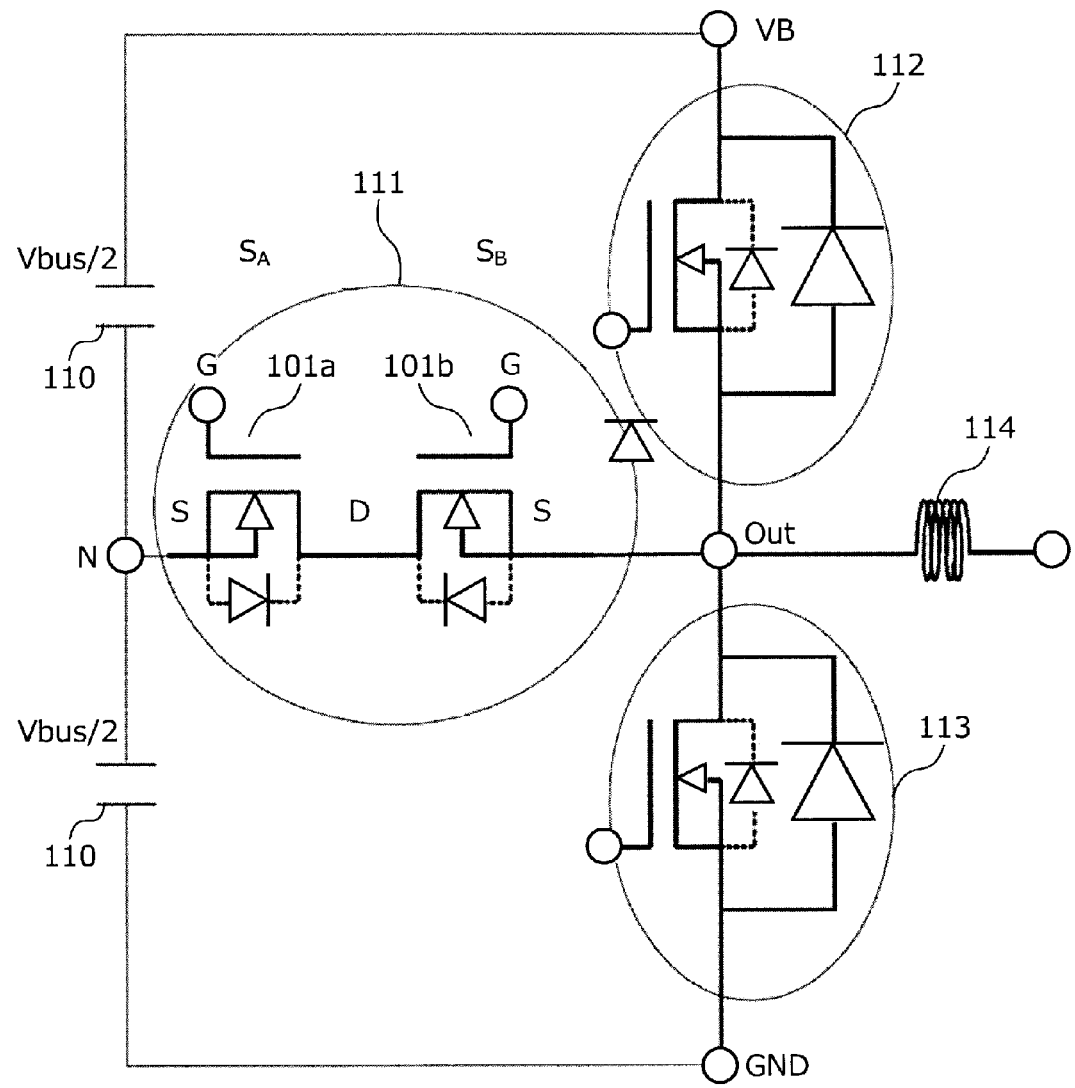
FIG. 25 is a circuit diagram illustrating the circuit configuration of a multilevel power converter.
Figure 26:
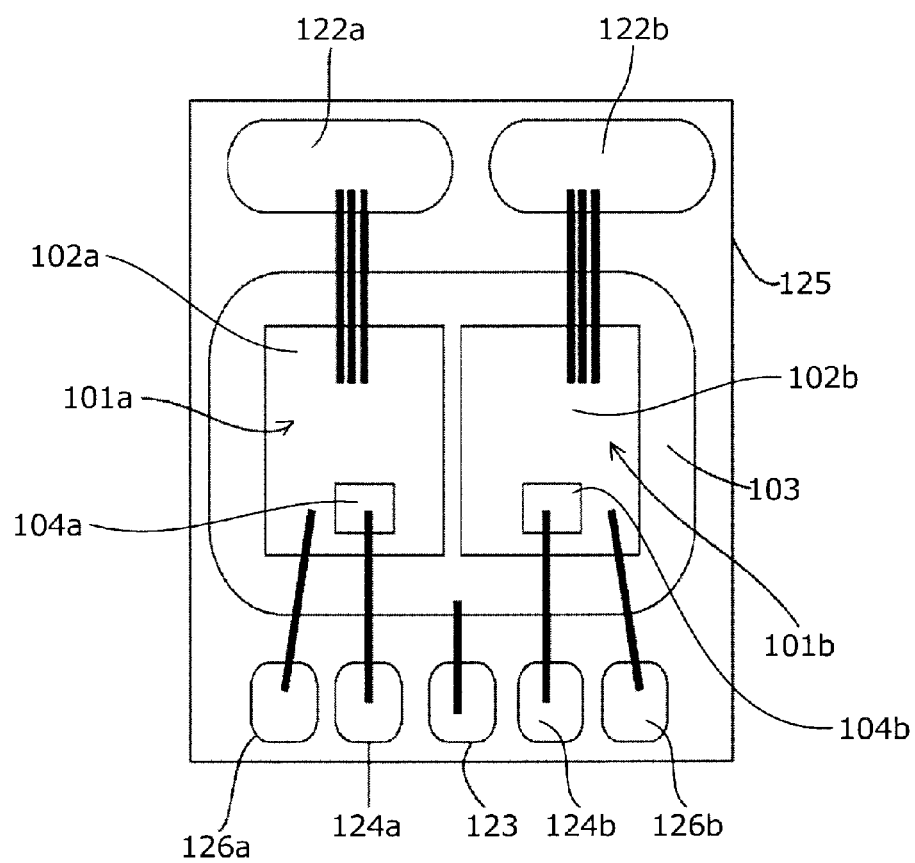
FIG. 26 is a plan view illustrating an example configuration inside a conventional semiconductor package case.
Figure 27:
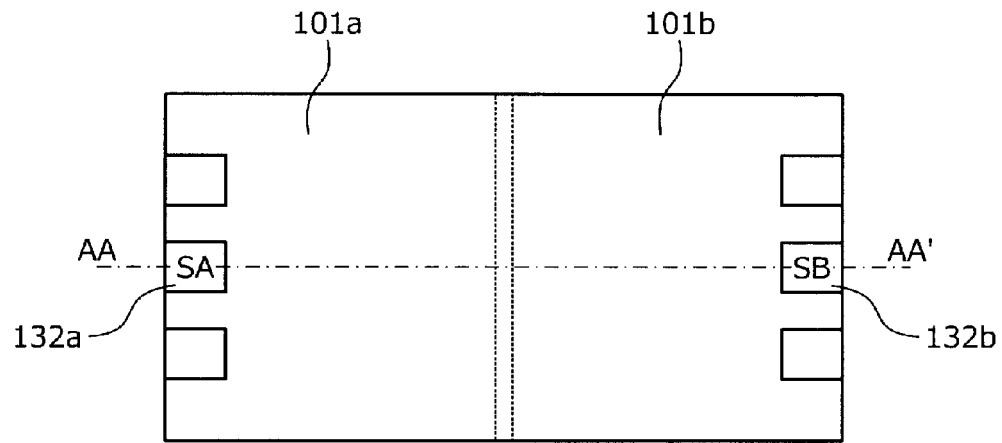
FIG. 27 is a plan view illustrating a configuration of a conventional semiconductor package from the top side (that is, the side on which the lid of the case is arranged).
Figure 28:
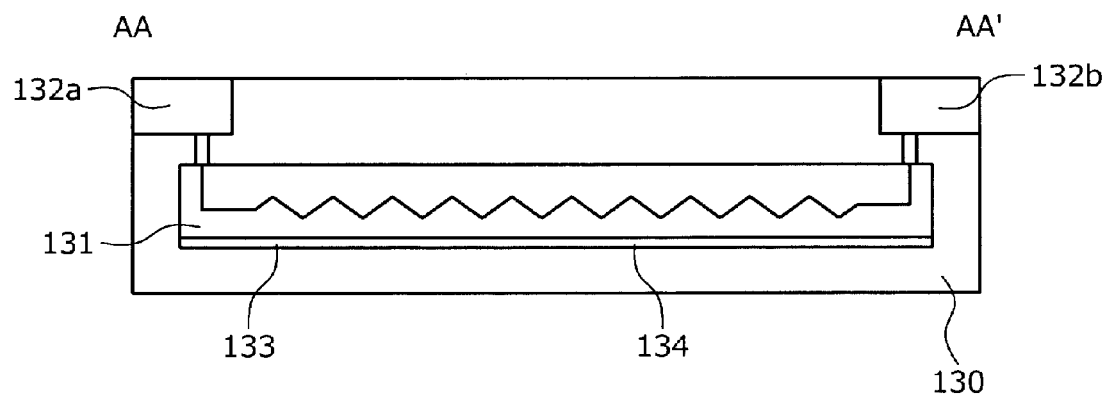
FIG. 28 is a cross-sectional view of a cross section taken along line AA-AA' in FIG. 27.
Figure 29:
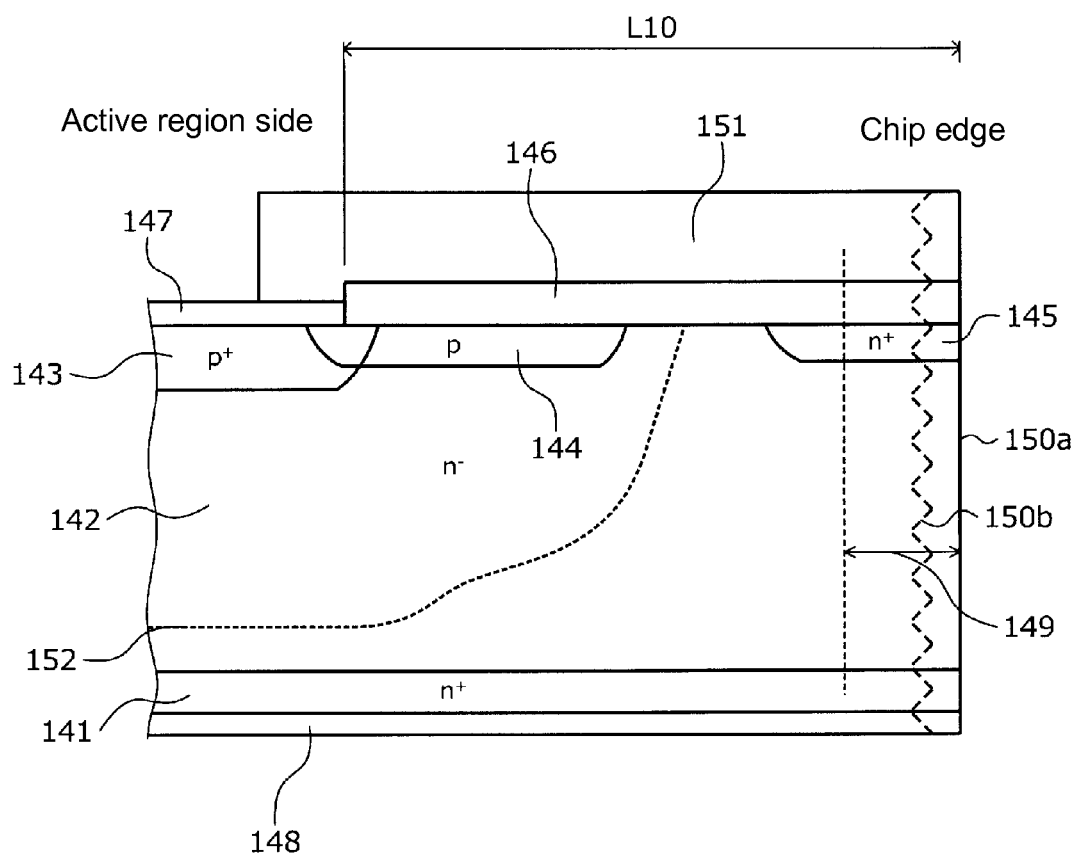
FIG. 29 is a cross-sectional view of an example edge termination structure in a conventional semiconductor device.

The semiconductor device according to Embodiment 1 is a bidirectional device in which drain terminals 103a and 103b of two MOSFET devices 101a and 101b (a first semiconductor element and a second semiconductor element) are electrically connected. The semiconductor device according to Embodiment 1 may have the same circuit configuration and be used in the same use cases as conventional semiconductor devices such as those shown in FIGS. 23 and 25, for example. As shown in FIG. 1, the MOSFET devices 101a and 101b of the bidirectional device are formed on the same semiconductor substrate (semiconductor chip).

The rear surface electrode (drain electrodes) of the MOSFET devices 101a and 101b are each connected to a copper (Cu) wiring layer formed on the surface of a ceramic substrate 25 (an insulating substrate) such as a DBC substrate. This copper wiring layer is connected to a drain pad 23 via a wire and serves as a common drain terminal 103 for the MOSFET devices 101a and 101b. The front surface electrodes (source terminals 102a and 102b) of the MOSFET devices 101a and 101b are connected via wires to source pads 22a and 22b, respectively, mounted on the surface of the insulating substrate 25. The source pads 22a and 22b are drawn out to the exterior of the case and serve as external connection terminals, for example.

The source pads 22a and 22b are the primary source terminals through which the large currents that flow through the MOSFET devices 101a and 101b are input. Moreover, the front surface electrodes of the MOSFET devices 101a and 101b are connected via wires to auxiliary source terminals 26a and 26b, respectively, mounted on the surface of the insulating substrate 25, for example. The auxiliary source terminals 26a and 26b serve as source potential connection terminals when a gate signal is applied. The gate electrodes (gate terminals 104a and 104b) of the MOSFET devices 101a and 101b are connected via wires to gate pads 24a and 24b, respectively, mounted on the surface of the insulating substrate 25.

Next, the planar structure of the semiconductor device according to Embodiment 1 will be described. As shown in FIG. 2, an n⁺ channel-stop region 13 (a second semiconductor region) that has a substantially rectangular ring-shaped planar shape that encloses the center of the chip is formed around the periphery of the chip. The portion of the semiconductor chip outside of the n⁺ channel-stop region 13 is part of an n⁻ drift layer 2 and serves as a scribe region 14 for when the overall semiconductor wafer is diced into individual chips. A p-type JTE region 4 (a first semiconductor region) is formed on the inner side of the n⁺ channel-stop region 13 and is separated therefrom. The portion of the chip between the n⁺ channel-stop region 13 and the p-type JTE region 4 is part of the n⁻ drift layer 2.

The n⁺ channel-stop region 13, the p-type JTE region 4, and the portion of the n⁻ drift layer 2 between the n⁺ channel-stop region 13 and the p-type JTE region 4 together form an edge termination structure 100b. The p-type JTE region 4 contacts p⁺ well regions (not shown in the figure) that form front surface structures of the MOSFET devices 101a and 101b. The p-type JTE region 4 has a lower concentration of impurities than the p⁺ well regions, and the edge termination structure 100b of the JTE structure is formed by arranging the p-type JTE region 4 at the terminations of the p-n junctions between the p⁺ well regions and the n⁻ drift layer 2. The edge termination structure 100b encloses an active region 100a through which current flows when the device is in the on state.

The MOSFET devices 101a and 101b are formed in the active region 100a. FIG. 2 illustrates the gate electrodes (gate terminals 104a and 104b) that form the MOS gate structures (insulated gates that have a metal-oxide film-semiconductor structure) of the MOSFET devices 101a and 101b. FIG. 2 also shows the front surface electrodes (the source terminals 102a and 102b) of the MOSFET devices 101a and 101b. The MOSFET devices 101a and 101b are electrically isolated from one another by an isolation structure 100c. In other words, the isolation structure 100c divides the active region 100a into two separate regions. More specifically, the isolation structure 100c includes the portions of the p-type JTE region 4 (the first to third p-type JTE regions 4a to 4c) between the MOSFET devices 101a and 101b as well as one or more trenches (such as the two trenches shown in FIG. 2 (the first and second trenches 5a and 5b)) formed between the MOSFET devices 101a and 101b.

The first and second trenches 5a and 5b run in a straight line through the p-type JTE region 4 and extend across the n⁻ drift layer 2 and the n⁺ channel-stop region 13 into the scribe region 14. FIG. 2 illustrates a ring-shaped trench 5 in which the ends of the parallel first and second trenches 5a and 5b are connected such that the trench 5 encloses a portion of the p-type JTE region 4. The trench 5 is filled with an insulating layer (not shown in the figure). The trench 5 separates the p-type JTE region 4 into a region 4a (a first p-type JTE region) in which the front surface structure of the MOSFET device 101a is arranged and a region 4b (a second p-type JTE region) in which the front surface structure of the MOSFET device 101b is arranged.

The first p-type JTE region 4a has a substantially rectangular ring-shaped planar shape that surrounds the portion in which the front surface structure of the MOSFET device 101a is arranged. The second p-type JTE region 4b has a substantially rectangular ring-shaped planar shape that surrounds the portion in which the front surface structure of the MOSFET device 101b is arranged. The portions of the first and second p-type JTE regions 4a and 4b that are part of the isolation structure 100c (that is, the portions of the first and second p-type JTE regions 4a and 4b sandwiched between the MOSFET devices 101a and 101b) each have a width that can withstand at least 60%, for example, of the guaranteed maximum OFF voltage. The reason for giving these portions of the first and second p-type JTE regions 4a and 4b a width that can withstand at least 60%, for example, of the guaranteed maximum OFF voltage the device can withstand in its OFF state is because doing so gives the structure a withstand voltage ratio similar to that of conventional structures (such as the structure shown in FIG. 30, for example), thereby making it possible to form the second trench 5b with the desired dimensions as well as to increase the manufacturability of the second trench 5b. The reference character 4c indicates the portion of the p-type JTE region 4 that is enclosed by the ring-shaped trench 5 (a third p-type JTE region).

Next, the cross-sectional structure of the semiconductor device according to Embodiment 1 will be described. As shown in FIG. 3, the n⁻ drift layer 2 is formed on the front surface of an n⁺ semiconductor substrate 1 (a semiconductor chip) that serves as an n⁺ drain layer. Rough surfaces are formed on both end faces of the chip (that is, both end faces of the n⁺ semiconductor substrate 1 and the n⁻ drift layer 2) due to a dicing process used to divide the overall semiconductor wafer into individual chips. The n⁺ channel-stop region 13 is selectively formed in the surface layer on the front surface of the n⁻ drift layer 2 (that is, the surface opposite to the n⁺ semiconductor substrate 1 side) in the edge termination structure 100b region that runs around the periphery of the chip. The n⁺ channel-stop region 13 is formed on the inner side of the scribe region that runs around the periphery of the chip.

Moreover, a p-type JTE region 4 is selectively formed in the surface layer on the front surface of the n⁻ drift layer 2 (that is, the surface opposite to the n⁺ semiconductor substrate 1 side) in the edge termination structure 100b region. The p-type JTE region 4 is formed on the inner side of the n⁺ channel-stop region 13 and is separated therefrom. The front surface structures of the MOSFET devices 101a and 101b are formed separated from one another in the n⁻ drift layer 2 in the active region 100a within the p-type JTE region 4. The front surface structures of the MOSFET devices 101a and 101b are surrounded, respectively, by the first and second p-type JTE regions 4a and 4b of the p-type JTE region 4.

As shown in FIG. 3, the MOSFET devices 101a and 101b are formed by arranging a plurality of unit cells (where each cell includes a single MOS gate structure) side by side in the active region 100a. Moreover, as shown in FIG. 3, the front surface structure of the MOSFET device 101a includes: a p-type base region 3c that forms the MOS gate structures; a gate insulation film; a gate electrode (the gate terminal 104a); and a p⁺ well region 3a (a third semiconductor region). Furthermore, as shown in FIG. 3, the front surface structure of the MOSFET device 101b includes: a p-type base region 3d that forms the MOS gate structures; a gate insulation film; a gate electrode (the gate terminal 104b); and a p⁺ well region 3b (a fourth semiconductor region).

The p⁺ well region 3a is formed in the active region 100a on the side of the front surface structure of the MOSFET device 101a nearest to the isolation structure 100c. The p⁺ well region 3a contacts the p-type base region 3c of the MOSFET device 101a as well as the first p-type JTE region 4a of the p-type JTE region 4. The p⁺ well region 3b is formed in the active region 100a on the side of the front surface structure of the MOSFET device 101b nearest to the isolation structure 100c. The p⁺ well region 3b contacts the p-type base region 3d of the MOSFET device 101b as well as the second p-type JTE region 4b of the p-type JTE region 4.

The p-type JTE region 4 is also formed in the isolation structure 100c region in the surface layer of the front surface of the n⁻ drift layer 2 (that is, the surface opposite to the n⁺ semiconductor substrate 1 side). Within this portion of the p-type JTE region 4, at least one trench 5 (the first and second trenches 5a and 5b) that goes through the entire p-type JTE region 4 in the thickness direction thereof and extends into the n⁻ drift layer 2 is formed. In the isolation structure 100c, the portion of the p-type JTE region 4 between the first trench 5a and the p⁺ well region 3a is the first p-type JTE region 4a. In the isolation structure 100c, the portion of the p-type JTE region 4 between the second trench 5b and the p⁺ well region 3b is the second p-type JTE region 4b.

In the isolation structure 100c, the portion of the p-type JTE region 4 between the first and second trenches 5a and 5b is the third p-type JTE region 4c. The isolation structure 100c includes these first to third p-type JTE regions 4a to 4c as well as the trench 5. The isolation structure 100c divides the active region 100a into a portion in which the front surface structure of the MOSFET device 101a is formed and a portion in which the front surface structure of the MOSFET device 101b is formed. The cross-sectional structure of the isolation structure 100c will be described in more detail later. A drain electrode 8 (a rear surface electrode) is formed on the rear surface of the n⁺ semiconductor substrate. The drain electrode 8 is bonded to a copper wiring layer formed on the insulating substrate 25 (a copper wiring layer that serves as the common drain terminal 103 for the MOSFET devices 101a and 101b) via a solder layer 26.

The depth D of the trench 5 may be greater than or equal to 1.75 μm and less than 5.0 μm. The width W of the trench 5 may be greater than or equal to 1.8 μm and less than 6.0 μm. Making the depth D of the trench 5 at least 1.75 μm and the width W of the trench 5 at least 1.8 μm makes it possible to give the isolation structure 100c a withstand voltage of 1400V or larger, thereby making the overall semiconductor device less susceptible to the effects of external electric charges. The reason for making the depth D of the trench 5 less than 5.0 μm and the width W of the trench 5 less than 6.0 μm is to improve manufacturability of the structure the present embodiment of the present invention. The reference character 10 indicates the rough edge face of the chip created during a dicing process.

Next, the cross-sectional structure of the isolation structure 100c will be described in detail. FIG. 4 shows the cross-sectional structure in a region 15 that surrounds the isolation structure 100c, as shown in FIG. 3. As shown in FIG. 4, the p-type JTE region 4 is formed between the portion in which the front surface structure of the MOSFET device 101a is formed and the portion in which the front surface structure of the MOSFET device 101b is formed. The MOSFET device 101a-side and MOSFET device 101b-side edges of the p-type JTE region 4 overlap, respectively, with the edges of the p⁺ well regions 3a and 3b of the front surface structures of the MOSFET devices 101a and 101b. In the following description, these portions in which the edges of the p-type JTE region 4 overlap with the edges of the p⁺ well regions 3a and 3b are referred to as the "junctions" between the p-type JTE region 4 and the p⁺ well regions 3a and 3b.

The p-type JTE region 4 is divided into a plurality of regions (the first to third p-type JTE regions 4a to 4c) by the first and second trenches 5a and 5b, which are arranged symmetrically around the center of the isolation structure 100c (referred to below simply as "the center of the structure"), for example. More specifically, the p-type JTE region 4 is divided into: the first p-type JTE region 4a between the p⁺ well region 3a and the first trench 5a; the second p-type JTE region 4b between the p⁺ well region 3b and the second trench 5b; and the third p-type JTE region 4c between the first and second trenches 5a and 5b. In other words, the isolation structure 100c in the present embodiment of the present invention differs from conventional edge termination structures such as the one shown in FIG. 30 in that the isolation structure 100c does not include portions corresponding to the n+ channel-stop region 145 or the portion of the n− drift layer 142 between the n+ channel-stop region 145 and the p-type JTE region 144.

An insulating layer 9 that spans from a portion of the p+ well region 3a to a portion of the p+ well region 3b and fills the first and second trenches 5a and 5b is formed on top of the first to third p-type JTE regions 4a to 4c. An interlayer insulating film 6 is formed on top of the insulating layer 9. The interlayer insulating film 6 may extend onto the p+ well regions 3a and 3b. Source electrodes 7a and 7b (first and second input electrodes) contact the p+ well regions 3a and 3b, respectively, and extend onto a portion of the interlayer insulating film 6. The source electrode 7a extends onto the interlayer insulating film 6, thereby covering the junction between the p+ well region 3a and the first p-type JTE region 4a. The source electrode 7b also extends onto the interlayer insulating film 6, thereby covering the junction between the p+ well region 3b and the second p-type JTE region 4b. This allows the source electrodes 7a and 7b to function as field plate electrodes.

A passivation film 11 is formed over the source electrodes 7a and 7b and the interlayer insulating film 6 and spans from a portion of the source electrode 7a to a portion of the source electrode 7b. The reference character 12 indicates a depletion layer that extends from the p-n junction between the p+ well region 3a and the n− drift layer 2 (the primary junction of the MOSFET device 101a). A similar depletion layer extends from the p-n junction between the p+ well region 3b and the n− drift layer 2 (the primary junction of the MOSFET device 101b), although this latter depletion layer is not shown in the figures.

Next, the method for manufacturing the semiconductor device according to Embodiment 1 will be described using an example case of manufacturing a silicon carbide MOSFET device in the 1200V withstand voltage class. FIGS. 5 to 12 are cross-sectional views illustrating the semiconductor device according to Embodiment 1 during steps in the method for manufacturing the semiconductor device. First, a silicon carbide n+ semiconductor substrate (semiconductor wafer) 1 is prepared as the initial substrate (wafer), for example. In the n+ semiconductor substrate 1, the (0001) plane (the so-called Si plane) or an off-angle plane inclined by 4° to 8°, for example, from the crystal axis of the (0001) plane is selected to be the main substrate surface. The n+ semiconductor substrate 1 may be a four-layer hexagonal silicon carbide single crystal (4H—SiC) substrate, for example. The n+ semiconductor substrate 1 may be a bulk substrate doped with n-type impurities such as nitrogen (N) to an impurity concentration greater than or equal to $5.0 \times 10^{18}/cm^3$ and less than or equal to $4.0 \times 10^{19}/cm^3$, for example. The thickness of the n+ semiconductor substrate 1 may be 320 μm, for example.

Next, the n+ semiconductor substrate 1 is inserted into the growth furnace of a hot-wall epitaxial growth device equipped with a heat source on the reactor sidewalls, for example, and maintained at a temperature of 160° C., for example. Then, hydrogen gas is injected into the growth furnace to clean the surface of the n+ semiconductor substrate 1 using a hydrogen gas chemical etching process. Next, monosilane ($SiH_4$) and dimethylmethane ($C_3H_8$) source gases are injected into the growth furnace, and the front surface of the n+ semiconductor substrate 1 is doped with n-type impurities such as nitrogen to an impurity concentration of $1.0 \times 10^{18}/cm^3$, for example, in order to induce epitaxial growth (ordered layering) of an n-type silicon carbide semiconductor buffer layer (not shown in the figure). The thickness of the n-type buffer layer may be set to a value greater than or equal to 0.5 μm, such as 1.0 μm for example.

Figure 5:
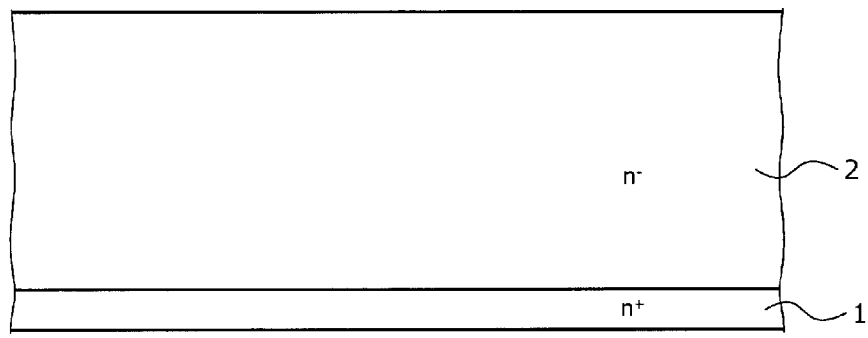
FIG. 5 is a cross-sectional view illustrating the semiconductor device according to Embodiment 1 during one step in a method for manufacturing the semiconductor device.

Next, the n-type buffer layer is uniformly doped with n-type impurities such as nitrogen to an impurity concentration greater than or equal to $5.0 \times 10^{15}/cm^3$ and less than or equal to $1.2 \times 10^{16}/cm^3$, for example, to induce epitaxial growth of an n− silicon carbide semiconductor drift layer 2 with a thickness greater than or equal to 10.0 μm and less than or equal to 12.0 μm, for example. This forms an epitaxial substrate (wafer) in which the n-type buffer layer and the n− drift layer 2 are layered in order on the front surface of the n+ semiconductor substrate 1. FIG. 5 illustrates the wafer up to this point in the manufacturing method.

Next, an oxide film 31 is formed over the entire front surface of the wafer (that is, on top of the n− drift layer 2) using a thermal oxidation or chemical vapor deposition (CVD) process. Then, the oxide film 31 is patterned using photolithography to remove the portions of the oxide film 31 located in regions where the p+ well regions 3a and 3b will be formed. Next, the remaining portions of the oxide film 31 are used as a mask during an ion implantation process 32 in which aluminum (Al) ions, for example, are implanted into the n− drift layer 2 to form the p+ well regions 3a and 3b on the front surface of the n− drift layer 2. The concentration of impurities in the p+ well regions 3a and 3b may be $2.0 \times 10^{18}/cm^3$, for example.

Figure 6:
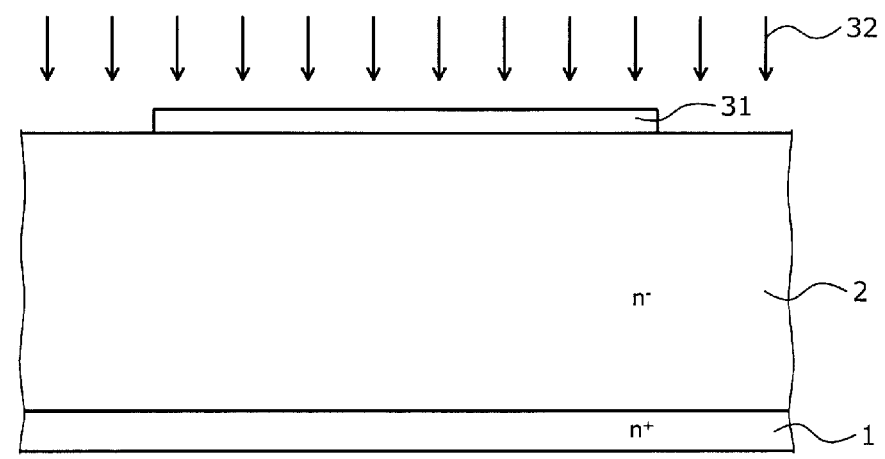
FIG. 6 is a cross-sectional view illustrating the semiconductor device according to Embodiment 1 during one step in a method for manufacturing the semiconductor device.

The ion implantation process 32 for forming the p+ well regions 3a and 3b may be conducted using an acceleration energy of greater than or equal to 20 keV and less than or equal to 220 keV, for example, and may be conducted one time or several times such that the total dosage is greater than or equal to $0.75 \times 10^{14}/cm^2$ and less than or equal to $1.5 \times 10^{14}/cm^2$. Moreover, during the ion implantation process 32 for forming the p+ well regions 3a and 3b, the substrate temperature may be maintained at a value greater than or equal to 500° C. and less than or equal to 800° C., for example, in order to inhibit amorphization of the p+ well regions 3a and 3b. FIG. 6 illustrates the wafer up to this point in the manufacturing method. Next, the remaining portions of the oxide film 31 are removed.

The p+ well regions 3a and 3b may also be layered on the n− drift layer 2 using a p+ epitaxial layer. In this case, after the n− drift layer 2 is formed, the p+ well regions 3a and 3b are formed on the n− drift layer 2 by layering an epitaxial p+ silicon carbide semiconductor layer of a prescribed concentration thereon. Next, an etching mask with openings in the regions where the edge termination structure 100b and the isolation structure 100c will be formed is formed over this p+ epitaxial layer. Then, the portions of the p+ epitaxial layer where the edge termination structure 100b and the isolation structure 100c will be formed may be removed using a wet etching process using this etching mask, for example.

Next, an oxide film 33 is formed over the entire front surface of the wafer (that is, on top of the n− drift layer 2 and the p+ well regions 3a and 3b) using a CVD process. Then, the oxide film 33 is patterned using photolithography to remove the portions of the oxide film 33 located in regions where the p-type JTE region 4 will be formed. Next, the remaining portions of the oxide film 33 are used as a mask during an ion implantation process 34 in which p-type impurities such as aluminum ions, for example, are implanted into the n− drift layer 2 to form the p-type JTE region 4 in the surface layer of the front surface of the n− drift layer 2. The concentration of impurities in the p-type JTE region 4 may be greater than or equal to $2.25 \times 10^{17}/cm^3$ and less than or equal to $3.5 \times 10^{17}/cm^3$, for example.

Figure 7:
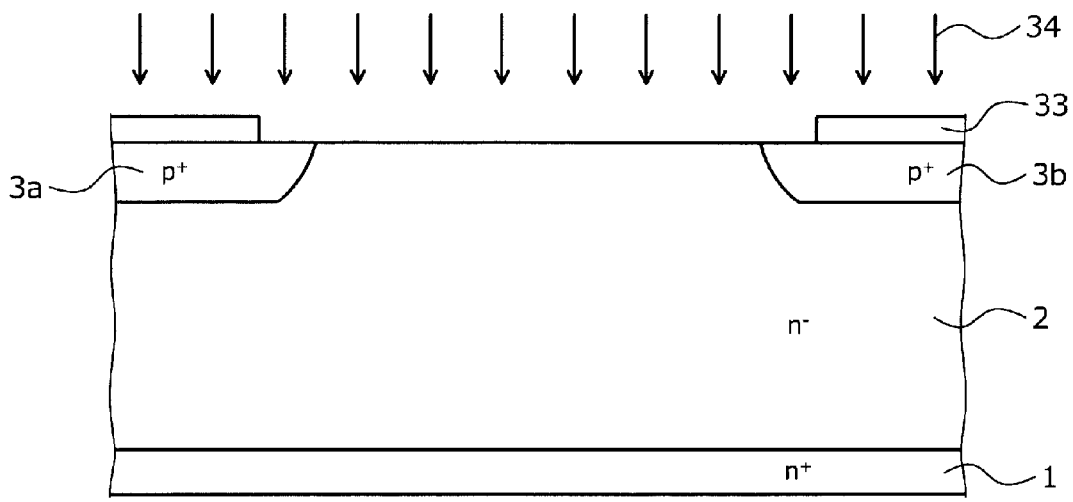
FIG. 7 is a cross-sectional view illustrating the semiconductor device according to Embodiment 1 during one step in a method for manufacturing the semiconductor device.

The ion implantation process 34 for forming the p-type JTE region 4 may be conducted using an acceleration energy of greater than or equal to 20 keV and less than or equal to 220 keV, for example, and may be conducted one time or several times such that the total dosage is greater than or equal to $1.1\times10^{13}/cm^2$ and less than or equal to $1.7\times10^{13}/cm^2$. Moreover, during the ion implantation process for forming the p-type JTE region 4, the substrate temperature may be maintained at a value greater than or equal to 500° C. and less than or equal to 800° C., for example, in order to inhibit amorphization of the p-type JTE region 4. FIG. 7 illustrates the wafer up to this point in the manufacturing method. Next, the remaining portions of the oxide film 33 are removed.

Next, ion implantation processes for forming the other portions of the MOS gate structures such as the $n^+$ source regions, the p-type base regions, and the $p^+$ body contact regions are performed in order at prescribed times. These steps are not shown in the figures. During the ion implantation process for forming the $n^+$ source regions, both the $n^+$ source regions and the $n^+$ channel-stop region 13 are formed. Next, a carbon cap layer (not shown in the figures) is formed over the entire exposed surface of the wafer. This cap layer may be an amorphous carbon layer formed using a sputtering process, for example. This cap layer may also be a carbon layer that is resistant to high temperatures and is formed using a method other than sputtering.

Figure 8:
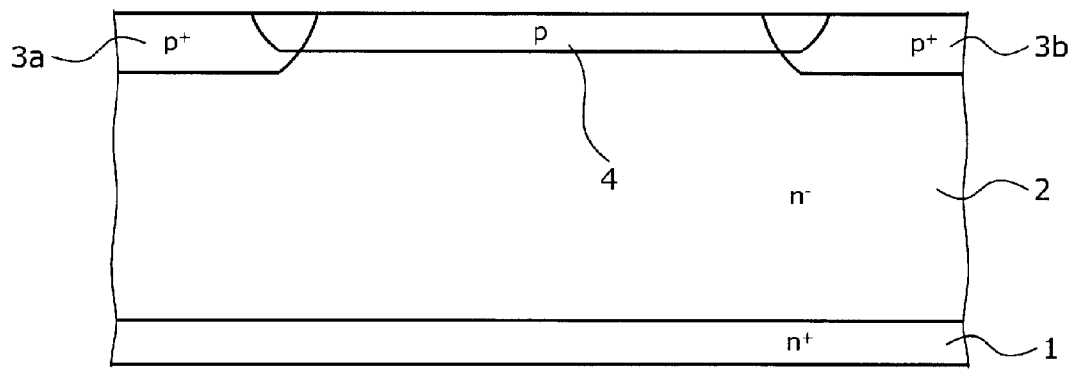
FIG. 8 is a cross-sectional view illustrating the semiconductor device according to Embodiment 1 during one step in a method for manufacturing the semiconductor device.

Next, the wafer is placed in an argon (Ar)-filled environment, for example, and a heat load that causes a prescribed rate of temperature increase is applied to the wafer. The wafer is then annealed (heat-treated) for 3 minutes at a temperature greater than or equal to 1750° C. and less than or equal to 1850° C. This annealing process activates at least 80% of the total dosage of the impurities implanted in each region during the ion implantation processes for forming the $p^+$ well regions 3a and 3b, the p-type JTE region 4, the $n^+$ source regions, the $p^+$ body contact regions, and the $n^+$ channel-stop region 13. Next, the cap layer is removed using an ashing process, and the wafer is cleaned. FIG. 8 illustrates the wafer up to this point in the manufacturing method.

Figure 9:
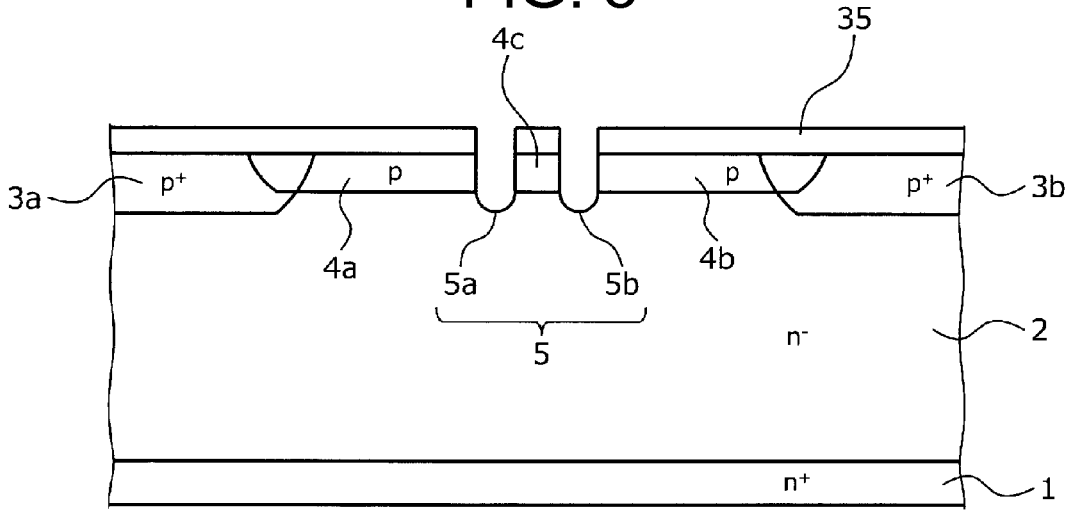
FIG. 9 is a cross-sectional view illustrating the semiconductor device according to Embodiment 1 during one step in a method for manufacturing the semiconductor device.

Next, an oxide film 35 is formed over the entire front surface of the wafer using a CVD process. Then, the oxide film 35 is patterned using photolithography to remove the portions of the oxide film 35 located in regions where the first and second trenches 5a and 5b will be formed. Next, the remaining portion of the oxide film 35 is used as a mask in an inductively coupled plasma reactive ion etching process, for example, in order to form the first and second trenches 5a and 5b through the p-type JTE region 4 and down into the $n^-$ drift layer 2. FIG. 9 illustrates the wafer up to this point in the manufacturing method.

During the etching process for forming the first and second trenches 5a and 5b, carbon tetrafluoride ($CF_4$) gas or a mixed gas containing sulfur hexafluoride ($SF_6$), oxygen ($O_2$), and hydrogen bromide (HBr) at a flow ratio of 1:1:6 may be used for the etching gas. Moreover, the thickness of the oxide film 35 that serves as the etching mask is related to the etching selection ratio between the ($SiO_2$) oxide film 35 and the silicon carbide (SiC) portion of the wafer when etching the trenches. When the etching selection ratio is greater than or equal to 4 and less than or equal to 8, for example, the thickness of the oxide film 35 may be set to a value greater than or equal to 0.5 µm and less than or equal to 0.8 µm and the width of the openings in the oxide film 35 (the width of the first and second trenches 5a and 5b) may be set to a value of 2.0 µm, for example, in order to form the first and second trenches 5a and 5b with a depth of 2 µm.

Figure 10:
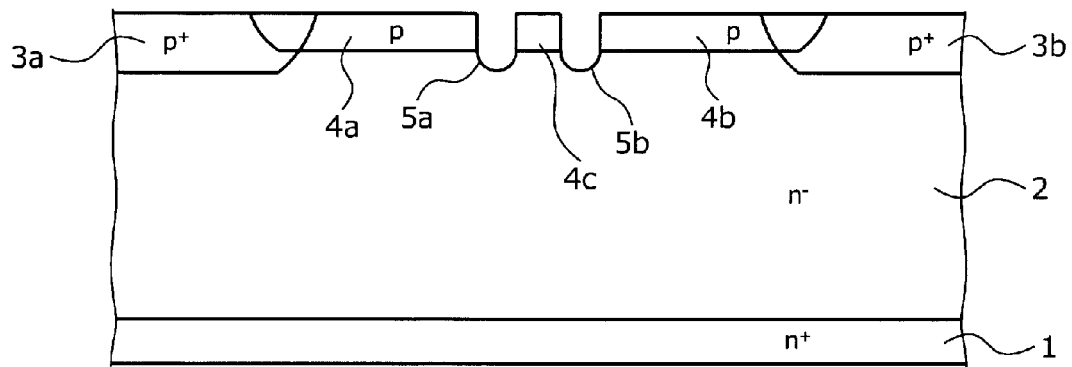
FIG. 10 is a cross-sectional view illustrating the semiconductor device according to Embodiment 1 during one step in a method for manufacturing the semiconductor device.

Next, the oxide film 35 is removed using a wet etching process, for example. Then, a wet thermal oxidation process is conducted at a temperature greater than or equal to 600° C. and less than or equal to 900° C., for example, in order to form a sacrificial oxide film (not shown in the figures) with a thickness of 30 nm, for example, over the entire front surface of the wafer as well as along the interior walls of the first and second trenches 5a and 5b. Next, the sacrificial oxide film is removed using a wet etching process, for example, and the entire front surface of the wafer as well as the interior walls of the first and second trenches 5a and 5b are cleaned. FIG. 10 illustrates the wafer up to this point in the manufacturing method.

Figure 11:
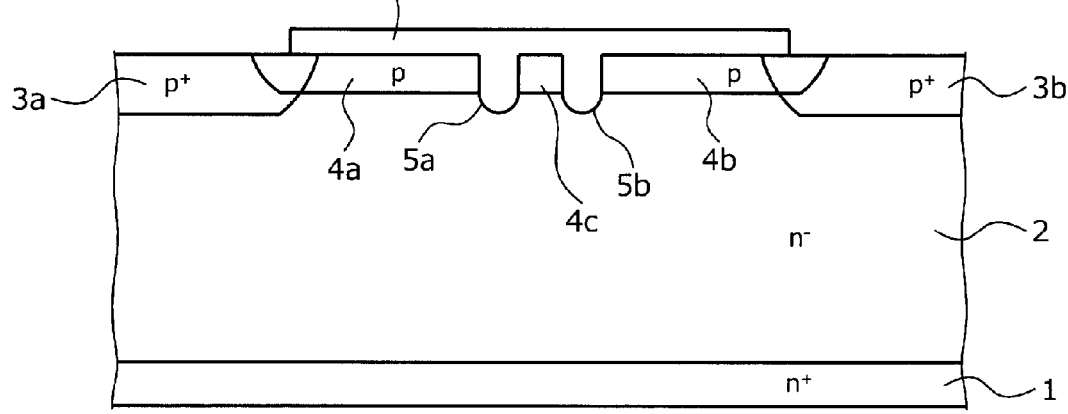
FIG. 11 is a cross-sectional view illustrating the semiconductor device according to Embodiment 1 during one step in a method for manufacturing the semiconductor device.

Next, an insulating layer 9 made from a high temperature oxide (HTO) film is layered over the entire front surface of the wafer such that the insulating layer 9 fills the first and second trenches 5a and 5b. The thickness of the insulating layer 9 formed on the front surface of the wafer is slightly more than half of the width of the first and second trenches 5a and 5b. When the width of the first and second trenches 5a and 5b is 2.0 µm, for example, the thickness of the insulating layer 9 is greater than or equal to 1.2 µm and less than or equal to 1.4 µm. Next, a resist mask that exposes the active region is formed using photolithography. Then, this resist mask is used in a wet etching process for patterning the insulating layer 9. The portions of the insulating layer 9 that cover the active region are removed, leaving the insulating layer 9 only on the portions of the wafer surface where the isolation structure will be located. Next, the resist mask used to pattern the insulating layer 9 is removed using a process such as ashing. FIG. 11 illustrates the wafer up to this point in the manufacturing method.

Figure 12:
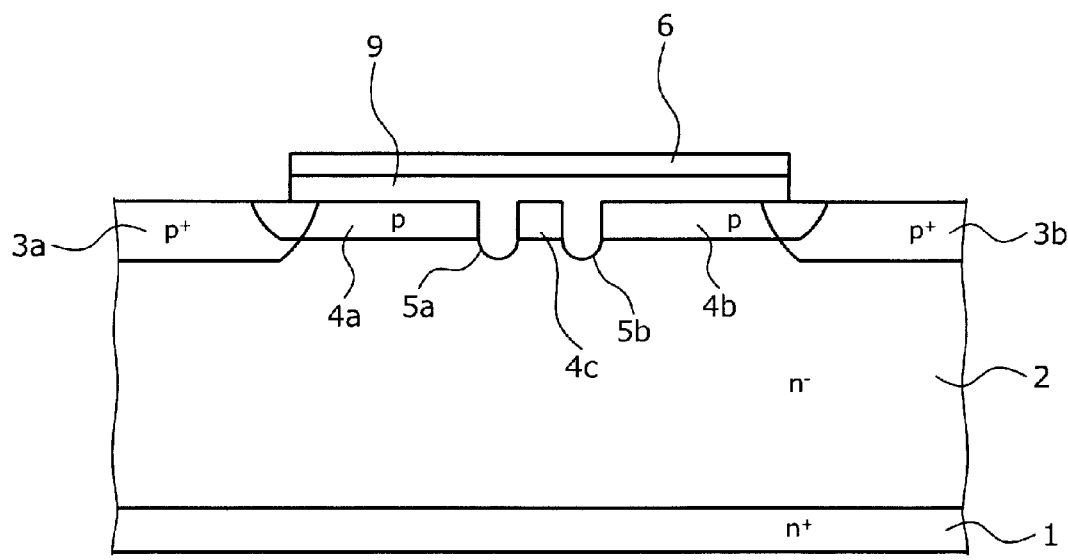
FIG. 12 is a cross-sectional view illustrating the semiconductor device according to Embodiment 1 during one step in a method for manufacturing the semiconductor device.

Next, the gate insulation films and gate electrodes of the MOSFET devices 101a and 101b are formed in the active region using a conventional method. This completes formation of the MOS gate structures on the front surface of the wafer. Next, an interlayer insulating film 6 that covers the MOS gate structures is formed over the entire front surface of the wafer. Then, portions of the interlayer insulating film 6 are selectively removed using a photolithography and etching process in order to form: contact holes (not shown in the figures) that expose the $n^+$ source regions, the p-type base region 3c, and the $p^+$ well region 3a of the MOSFET device 101a; contact holes (not shown in the figures) that expose the $n^+$ source regions, the p-type base region 3d, and the $p^+$ well region 3b of the MOSFET device 101b; and contact holes (not shown in the figures) that expose the gate electrodes. Next, the resist mask used to pattern the interlayer insulating film 6 is removed. FIG. 12 illustrates the wafer up to this point in the manufacturing method.

Next, nickel (Ni) films (not shown in the figures) with a thickness of 100 nm are layered onto the front and rear surfaces of the wafer. Then, the wafer is placed in an argon-filled environment, for example, and annealed for 2 minutes at a temperature greater than or equal to 950° C. and less than or equal to 1000° C. to cause silicidation of the nickel films and form nickel silicide films. This forms an ohmic contact (an electrical junction) between the silicon carbide semiconductor and the nickel silicide films. Next, a titanium nitride (TiN) film, a titanium (Ti) film, and an aluminum-silicon (AlSi) film, for example, are layered in order over the entire front surface of the wafer such that each contact hole is filled in order to form a front surface electrode.

The thicknesses of the titanium nitride film and the titanium film of the front surface electrode may be 50 nm and 100 nm, respectively, for example. The thickness of the aluminum-silicon film of the front surface electrode may be greater than or equal to 3 µm and less than or equal to 5 µm, for example. The amount of silicon in the aluminum-silicon film of the front surface electrode may be greater than or equal to 2% and less than or equal to 5% by weight percent, for example. Next, the front surface electrode is patterned using a photolithography and etching process to form the source electrodes (source pads) 7a and 7b and the gate pads. Next, the resist mask used to pattern the source electrodes 7a and 7b is removed.

Then, a passivation film 11 is formed over the entire front surface of the wafer. Next, portions of the passivation film are selectively removed using a photolithography and etching process to expose the source pads and gate pads. Then, a layered metal film made by layering a titanium nitride film, a nickel film, and a silver (Ag) film in order or a layered metal film made by layering a titanium nitride film, a nickel film, and a gold (Au) film in order is formed over the entire rear surface of the wafer to form the drain electrode 8. Next, the wafer is placed in a nitrogen-filled environment, for example, and the drain electrode 8 is sintered at a temperature greater than or equal to 300° C. and less than or equal to 400° C. Finally, the wafer is diced into individual chips. This completes the bidirectional device shown in FIGS. 3 and 4.

The dimensions for each portion of the isolation structure 100c are not particularly limited, and the following dimensions may be used when the semiconductor device according to Embodiment 1 is a silicon carbide semiconductor device in the 1200V withstand voltage class, for example. The half-length (half-width) L0 of the isolation structure 100c is 40 µm. The half width of the isolation structure 100c is the distance from the center of the structure (that is, the center of the isolation structure 100c or the center of the third p-type JTE region 4c) to the $p^+$ well region 3a-side edge (or the $p^+$ well region 3b-side edge) of the interlayer insulating film 6. The distance Lc from the center of the first trench 5a to the center of the structure is 4 µm. The distance Lp from the structure center-side edge of the first p-type JTE region 4a (that is, the interface between the first p-type JTE region 4a and the first trench 5a) to the $p^+$ well region 3a-side edge of the interlayer insulating film 6 that covers the first p-type JTE region 4a is 35 µm. The width W and depth D of the first and second trenches 5a and 5b are 2 µm and 2 µm, respectively. The diffusion depth Xj of the p-type JTE region 4 (the first to third p-type JTE regions 4a to 4c) is 0.5 µm. Here, the dimensions of the MOSFET device 101a-side portions of the isolation structure 100c are described. However, the MOSFET device 101a and the MOSFET device 101b are arranged symmetrically with the third p-type JTE region 4c at the center, and therefore the dimensions of the equivalent MOSFET device 101b-side portions of the isolation structure 100c are the same.

Figure 13:
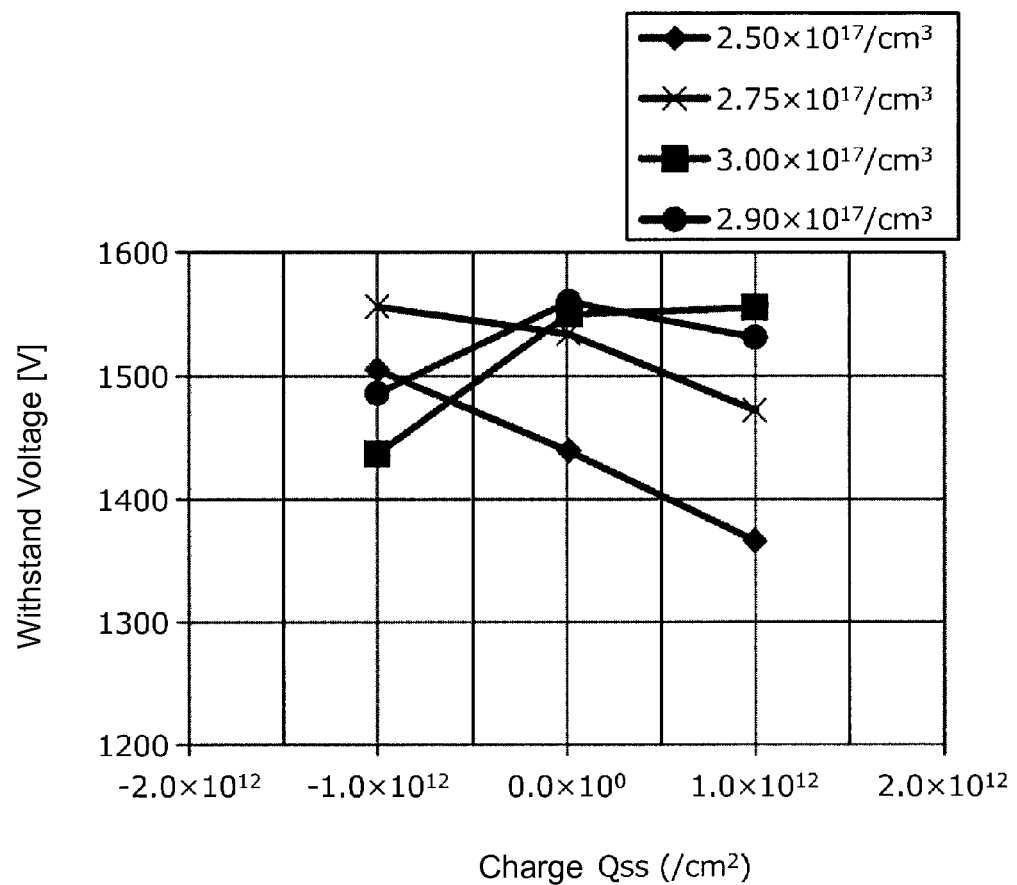
FIG. 13 is a graph showing the relationship between withstand voltage and charge resistance in an isolation structure for several different concentrations of impurities in a p-type JTE region in a semiconductor device in Working Example 1.

Next, the withstand voltage of the isolation structure 100c was tested. FIG. 13 is a graph showing the relationship between withstand voltage and charge resistance in the isolation structure for several different concentrations of impurities in the p-type JTE region in a semiconductor device in Working Example 1. In Working Example 1, the relationship between the withstand voltage of the isolation structure 100c and the charge Qss at the interface between the interlayer insulating film 6 and the passivation film 11 when a positive charge Qox with a value of $1\times10^{11}/cm^2$ was applied to the interface between the insulating layer 9 and the silicon carbide semiconductor portion of the device was simulated. The example dimensions described for the isolation structure 100c in the method for manufacturing the semiconductor device according to Embodiment 1 were used as the initial test conditions. The withstand voltage of the isolation structure 100c was defined to be the voltage at which a current of 10 µA flows between the source electrodes 7a and 7b that are separated by the isolation structure 100c when the length of the isolation structure 100c in the direction orthogonal to the direction in which the MOSFET devices 101a and 101b are arranged (that is, the direction parallel to the direction in which the first and second trenches 5a and 5b run) is set to a value of $1\times10^8$ µm. In the following description, this length is referred to simply as the "equivalent length". FIG. 13 shows the results of Working Example 1 for several different concentrations of impurities of the p-type JTE region 4. The results shown in FIG. 13 indicate that when the impurity concentration (that is, the concentration of electrically active impurities) in the p-type JTE region 4 is greater than or equal to $2.50\times10^{17}/cm^3$ and less than or equal to $3.00\times10^{17}/cm^3$, a withstand voltage of 1350V or higher can be achieved in the isolation structure 100c at room temperature (25° C., for example). Moreover, the interface between the interlayer insulating film 6 and the passivation film 11 has a charge resistance greater than or equal to $-1.0\times10^{12}/cm^2$ and less than or equal to $+1.0\times10^{12}/cm^2$.

Figure 14:
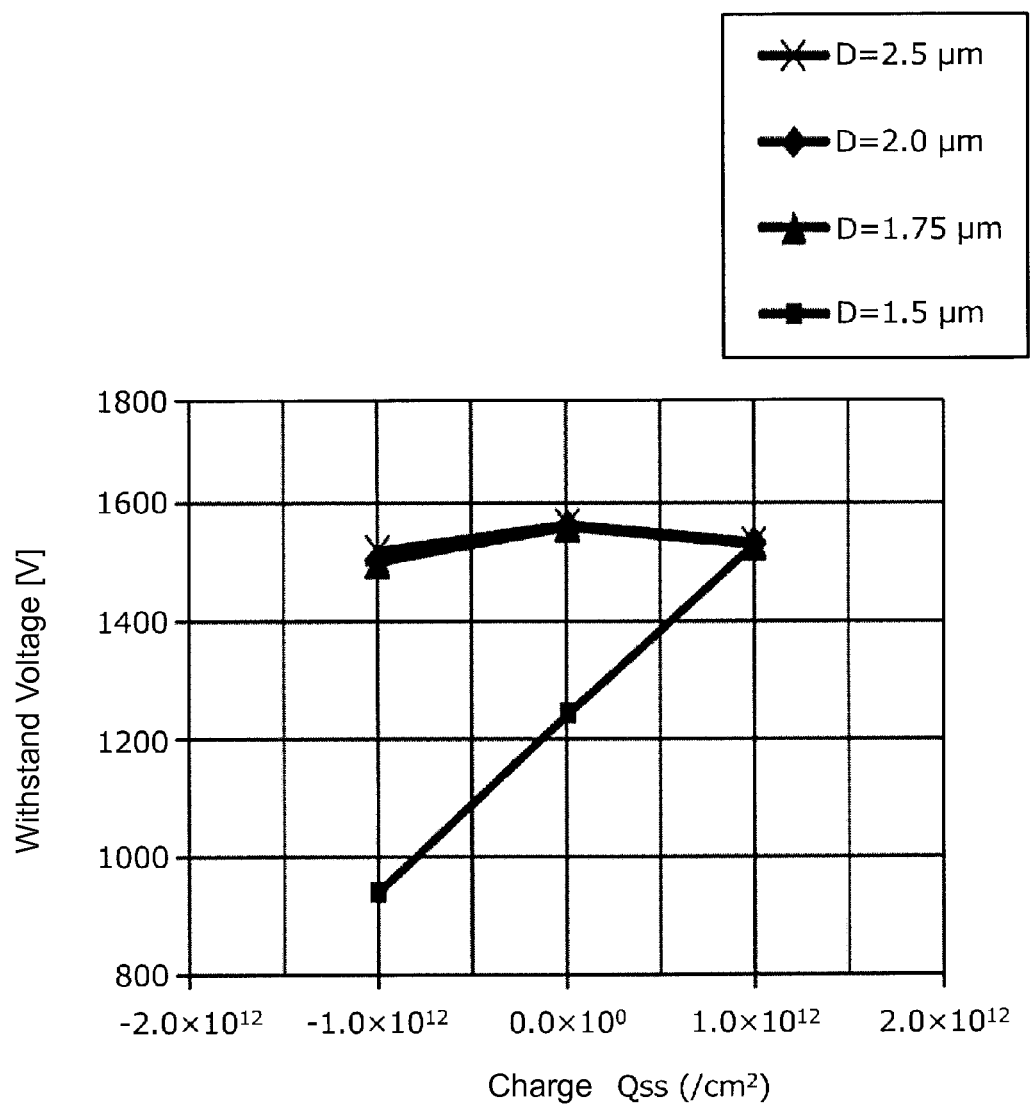
FIG. 14 is a graph showing the relationship between withstand voltage and charge resistance in an isolation structure for several different trench depths in a semiconductor device in Working Example 2.

Next, in Working Example 2, a variety of different depths D were used for the trench 5 (the first and second trenches 5a and 5b). FIG. 14 shows the results of Working Example 2. FIG. 14 is a graph showing the relationship between withstand voltage and charge resistance in the isolation structure for several different trench depths in a semiconductor device in Working Example 2. In Working Example 2, an impurity concentration of $2.90\times10^{17}/cm^3$ was used for the p-type JTE region 4. Other than the impurity concentration of the p-type JTE region 4 and the depth D of the trench 5, the simulation conditions used in Working Example 2 were the same as those used in Working Example 1. The results shown in FIG. 14 indicate that when the depth D of the trench 5 is 1.75 µm or higher, a withstand voltage of 1400V or higher can be achieved in the isolation structure 100c at room temperature. Moreover, the interface between the interlayer insulating film 6 and the passivation film 11 has a charge resistance greater than or equal to $-1.0\times10^{12}/cm^2$ and less than or equal to $+1.0\times10^{12}/cm^2$.

Figure 15:
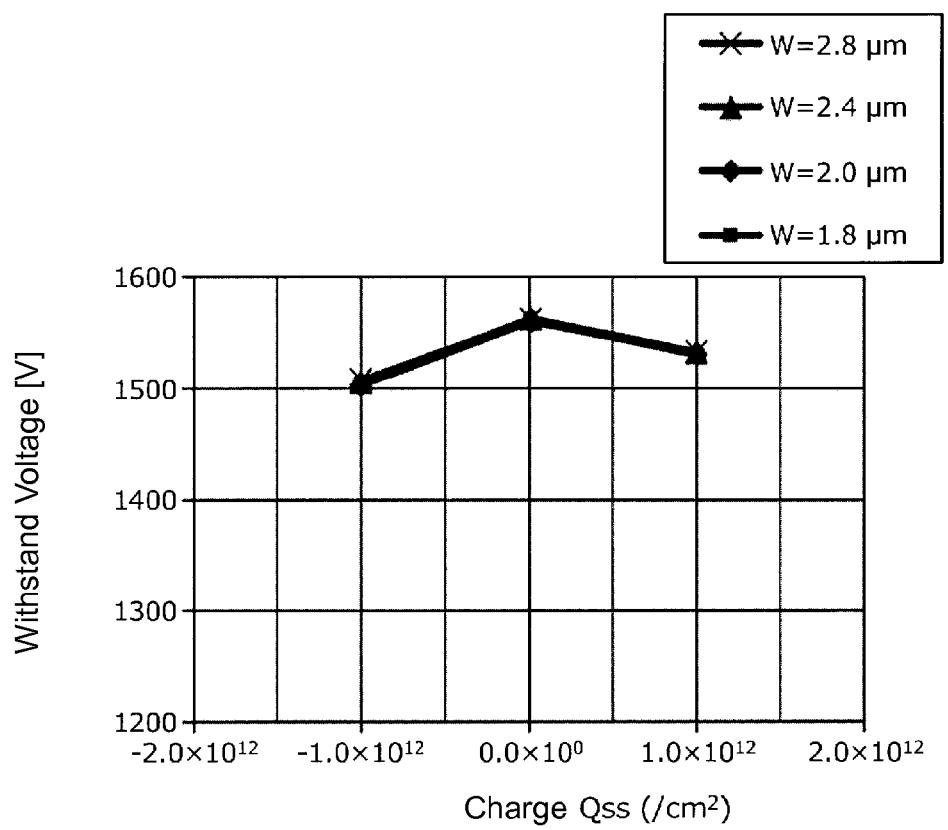
FIG. 15 is a graph showing the relationship between withstand voltage and charge resistance in an isolation structure for several different trench widths in a semiconductor device in Working Example 3.

Next, in Working Example 3, a variety of different widths W were used for the trench 5 (the first and second trenches 5a and 5b). FIG. 15 shows the results of Working Example 3. FIG. 15 is a graph showing the relationship between withstand voltage and charge resistance in an isolation structure for several different trench widths in a semiconductor device in Working Example 3. In Working Example 3, an impurity concentration of $2.90\times10^{17}/cm^3$ was used for the p-type JTE region 4. Other than the impurity concentration of the p-type JTE region 4 and the width W of the trench 5, the simulation conditions used in Working Example 3 were the same as those used in Working Example 1. The results shown in FIG. 15 indicate that when the width W of the trench 5 is 1.8 µm or higher, a withstand voltage of 1400V or higher can be achieved in the isolation structure 100c at room temperature. Moreover, the interface between the interlayer insulating film 6 and the passivation film 11 has a charge resistance greater than or equal to $-1.0\times10^{12}/cm^2$ and less than or equal to $+1.0\times10^{12}/cm^2$.

Figure 33:
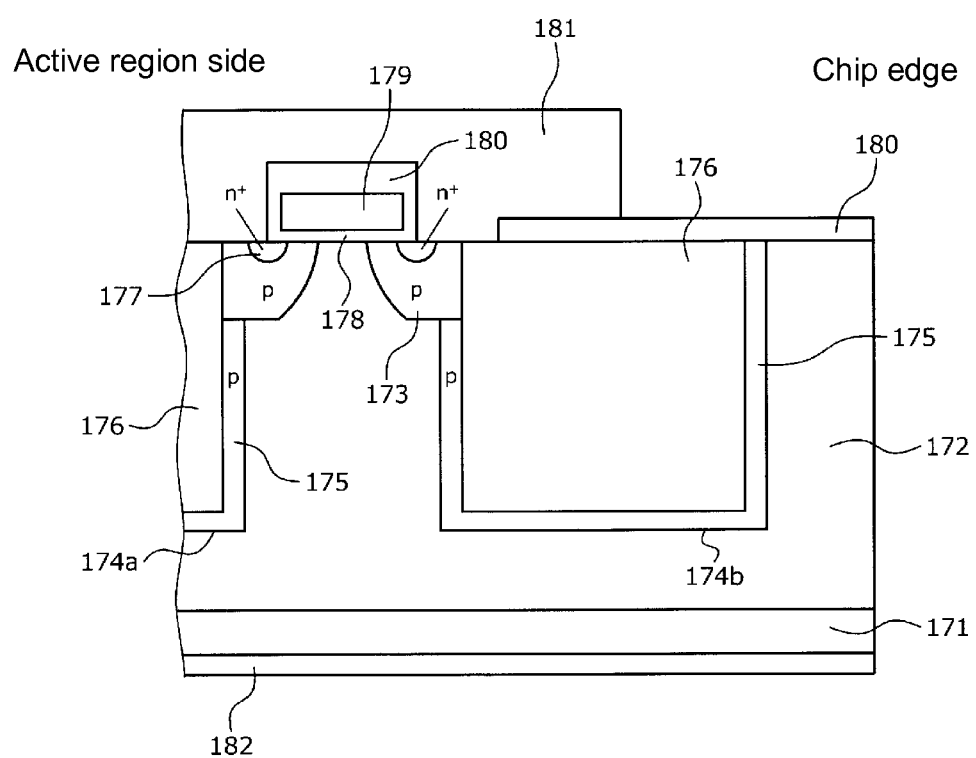
FIG. 33 is a cross-sectional view of another example of an edge termination structure in a conventional super junction semiconductor device.

Meanwhile, in a comparison example, a case in which only one trench that goes through the p-type JTE region 4 in the thickness direction thereof is formed in the isolation structure and the third p-type JTE region 4c is therefore not formed in the isolation structure was simulated using the same conditions used in Working Example 1. Although the results are not illustrated here, the inventor found that in the present comparison example, withstand voltage and charge resistance values similar to those in observed in Working Example 1 can be achieved in the isolation structure using any of the following sets of conditions. To achieve a withstand voltage and charge resistance similar to those in Working Example 1 in the isolation structure in the present comparison example, the width of the trench must be greater than or equal to 6 μm and the depth of the trench must be greater than or equal to 5.0 μm, or alternatively, the width of the trench must be greater than or equal to 10 μm and the distance from the interface between the trench and the n⁻ drift layer 2 to the bottom of the trench (that is, the depth of the trench) must be greater than or equal to 12 μm and less than or equal to 14 μm. Other than the structure of the p-type JTE region 4 and the structure of the trench, the simulation conditions used in the present comparison example were the same as those used in Working Example 1. Although forming a trench with these dimensions is easier than forming the termination region trench 174b shown in FIG. 33 and disclosed in Non-Patent Document 1, the trench in the present comparison example has worse manufacturability than the trenches in Working Examples 1 to 3.

Figure 16:
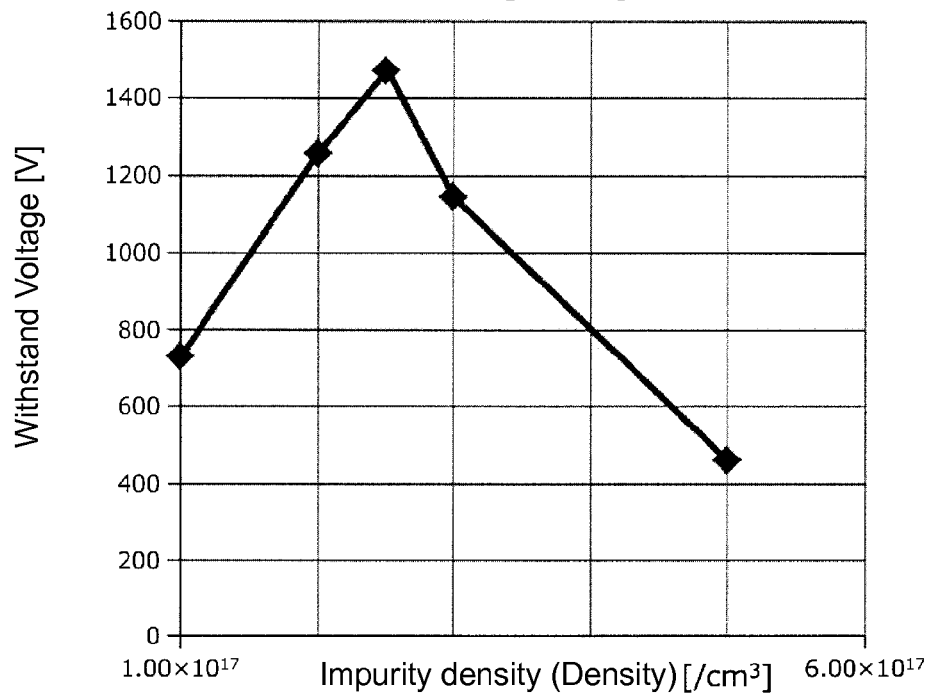
FIG. 16 is a graph showing the relationship between the concentration of impurities in a p-type JTE region and the withstand voltage of an isolation structure in an example of a conventional semiconductor device.
Figure 30:
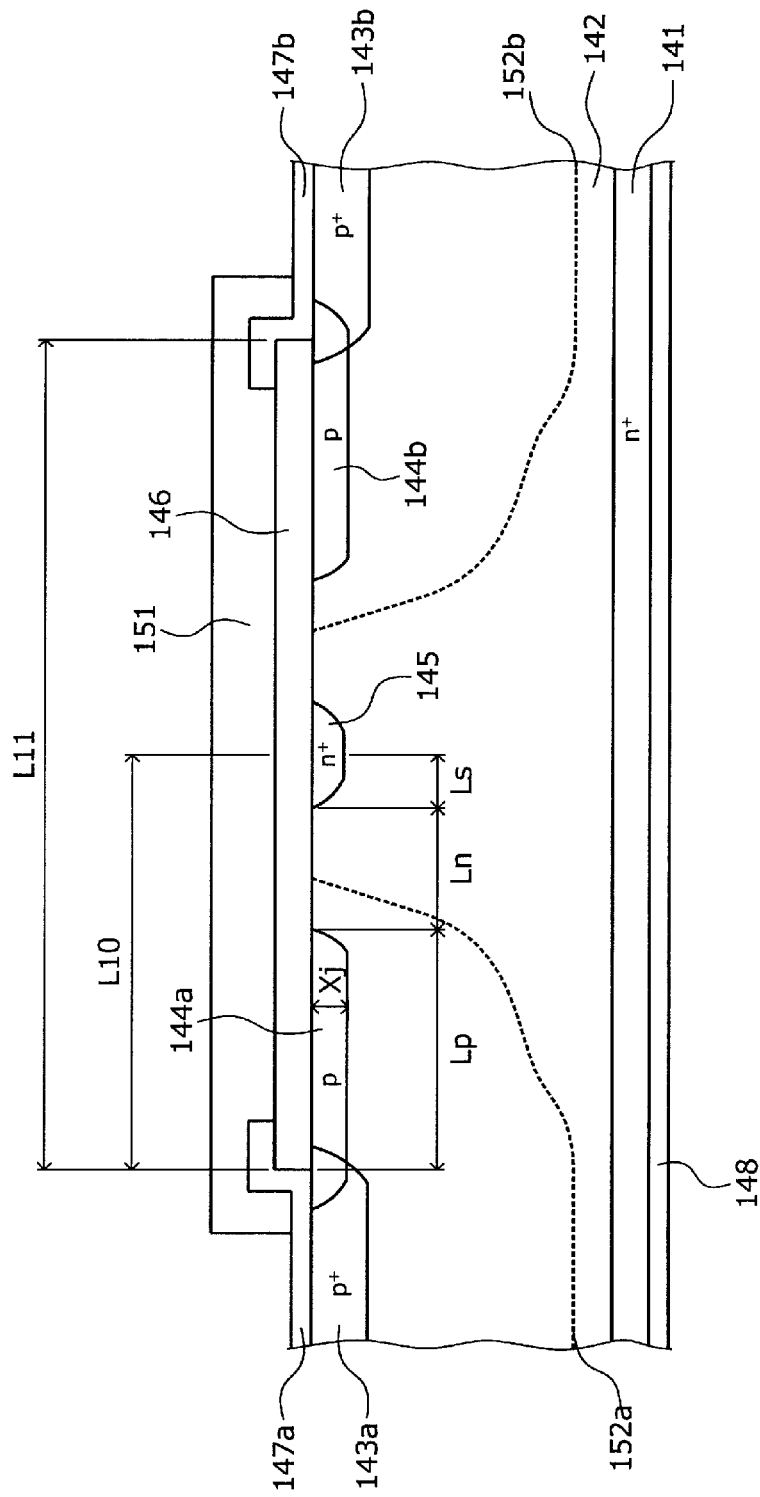
FIG. 30 is a cross-sectional view of another example of an edge termination structure in a conventional semiconductor device.

Moreover, for purposes of comparison, the withstand voltage of the conventional example of an isolation structure shown in FIG. 30 was tested. In this isolation structure, the MOSFET devices 101a and 101b are arranged symmetrically with the n⁺ channel-stop region 145 at the center. FIG. 16 is a graph showing the relationship between the concentration of impurities in the p-type JTE region and the withstand voltage of the isolation structure in this example of a conventional semiconductor device. In the conventional example, the distance Lp from the n⁺ channel-stop region 145-side edge of the MOSFET device 101a-side p-type JTE region 144a (a first p-type JTE region) to the p⁺ well region 143a-side edge of the interlayer insulating film 146 was set to 40 μm. The distance Ln between the n⁺ channel-stop region 145 and the first p-type JTE region 144a was set to 20 μm. The half-width Ls of the n⁺ channel-stop region 145 was set to 2 μm. In other words, the length L11 of the overall isolation structure was approximately 120 μm (L11=2×L10). The diffusion depth Xj of the first p-type JTE region 144a was set to 0.5 μm. The positive charge Qox applied to the interface between the interlayer insulating film 146 and the silicon carbide semiconductor portion of the device was set to a value of $1.0 \times 10^{11}$/cm². The charge Qss at the interface between the interlayer insulating film 146 and the passivation film 151 was set to a value of $1.0 \times 10^{10}$/cm². The withstand voltage of the isolation structure was defined in the same manner as in Working Example 1. FIG. 16 shows the results of the present comparison example for several different concentrations of impurities of the first p-type JTE region 144a. The results shown in FIG. 16 indicate that in the conventional example, when the concentration of impurities in the first p-type JTE region 144a is close to $2.50 \times 10^{17}$/cm³, a peak withstand voltage of 1400V or higher can be achieved in the isolation structure at room temperature.

Figure 17:
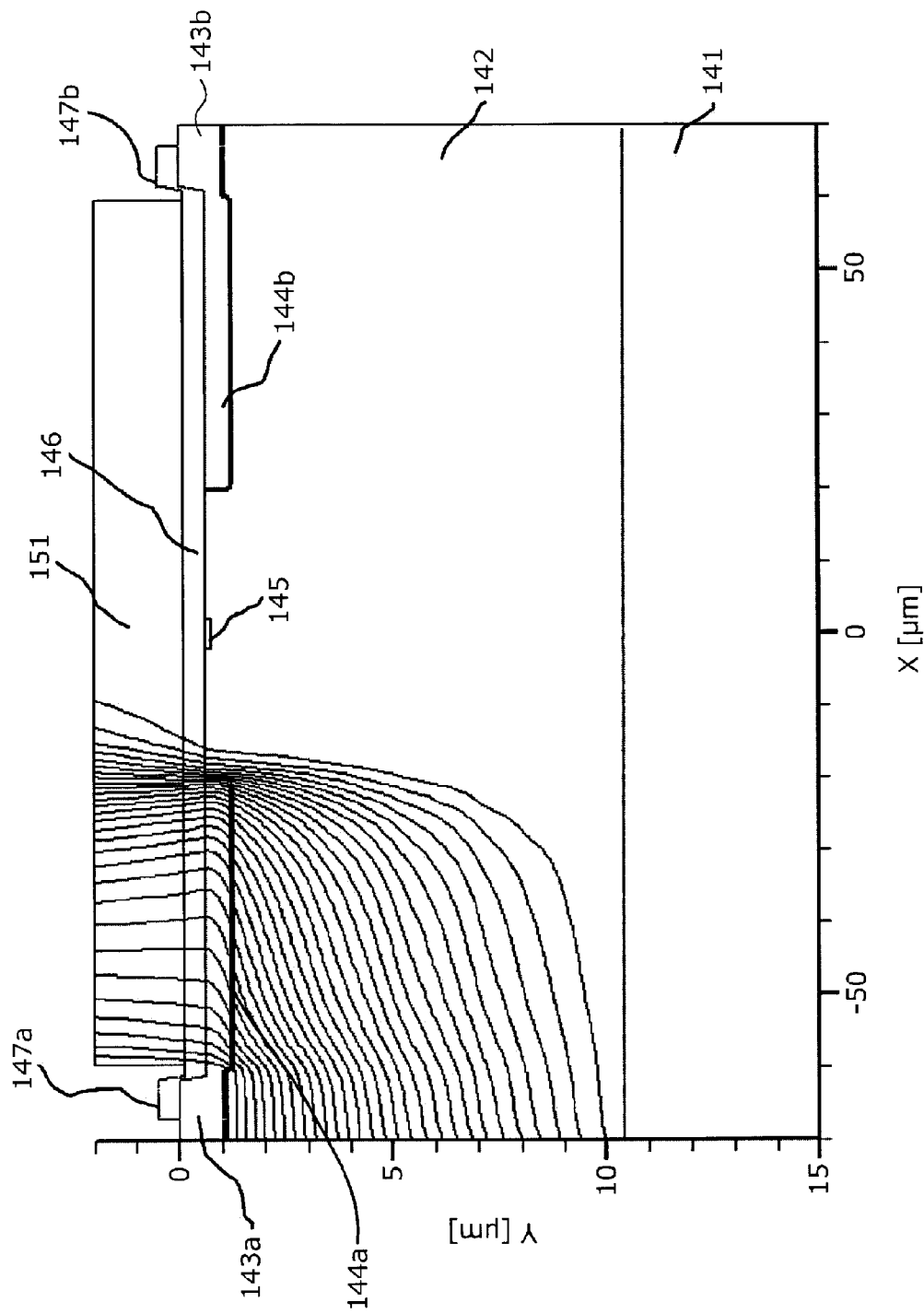
FIG. 17 illustrates the electrostatic potential distribution in an example of a conventional semiconductor device.
Figure 18:
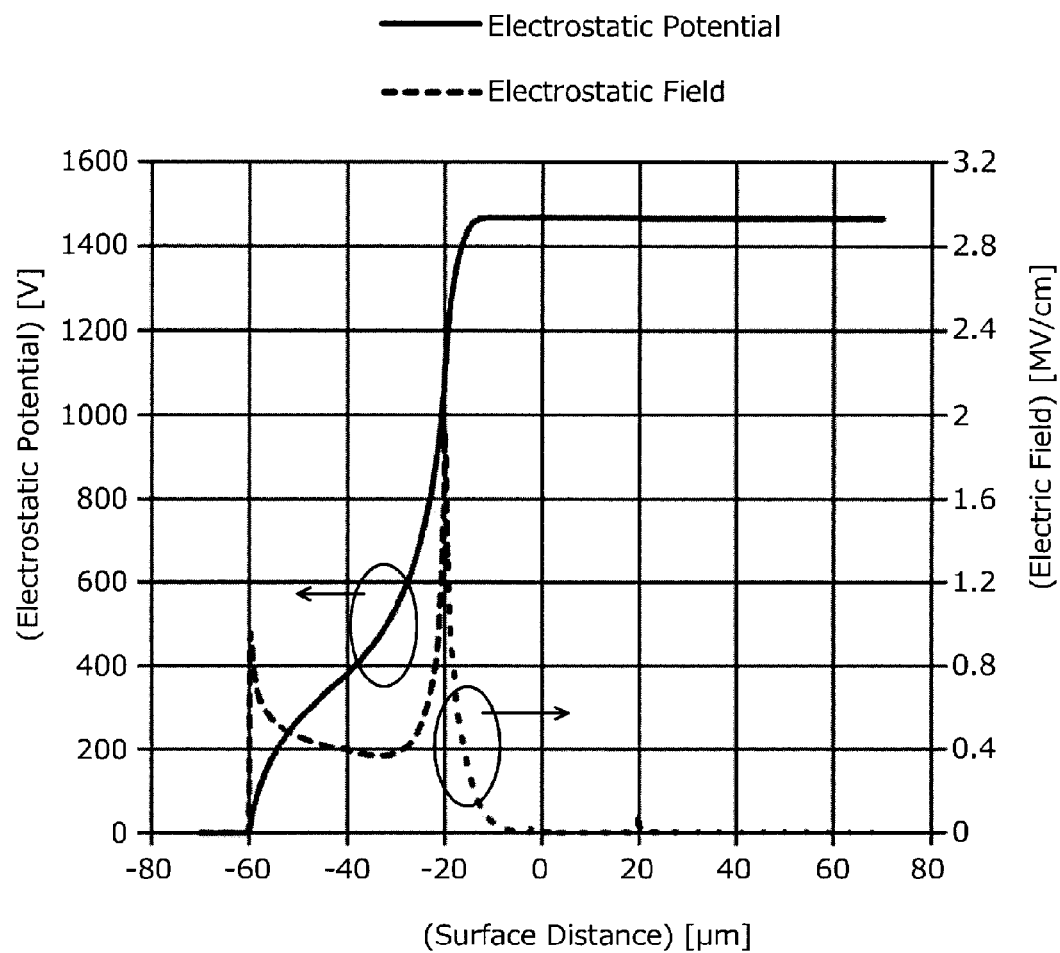
FIG. 18 is a graph showing the electrostatic potential distribution and the electric field strength distribution in an example of a conventional semiconductor device.

FIG. 17 shows the electrostatic potential distribution in this conventional example. Moreover, FIG. 18 shows the electrostatic potential (left vertical axis) and the electric field strength (right vertical axis) at a position 0.1 μm below the interface between the interlayer insulating film 146 and the silicon carbide semiconductor portion of the device. FIG. 17 illustrates the electrostatic potential distribution in the example of a conventional semiconductor device. FIG. 18 is a graph showing the electrostatic potential distribution and the electric field strength distribution in the example of a conventional semiconductor device. On the horizontal axis in FIG. 18, 0 μm is the position at the center of the structure (that is, at the center of the n⁺ channel-stop region 145), the negative values indicate positions on the MOSFET device 101a side of the center of the isolation structure, and the positive values indicate positions on the MOSFET device 101b side of the center of the isolation structure. The results shown in FIGS. 17 and 18 indicate that in this conventional example, the electric field was strongest at the n⁺ channel-stop region 145-side edge of the first p-type JTE region 144a, and that the first p-type JTE region 144a was subjected to a voltage of approximately 950V (60% or more of the withstand voltage).

Figure 19:
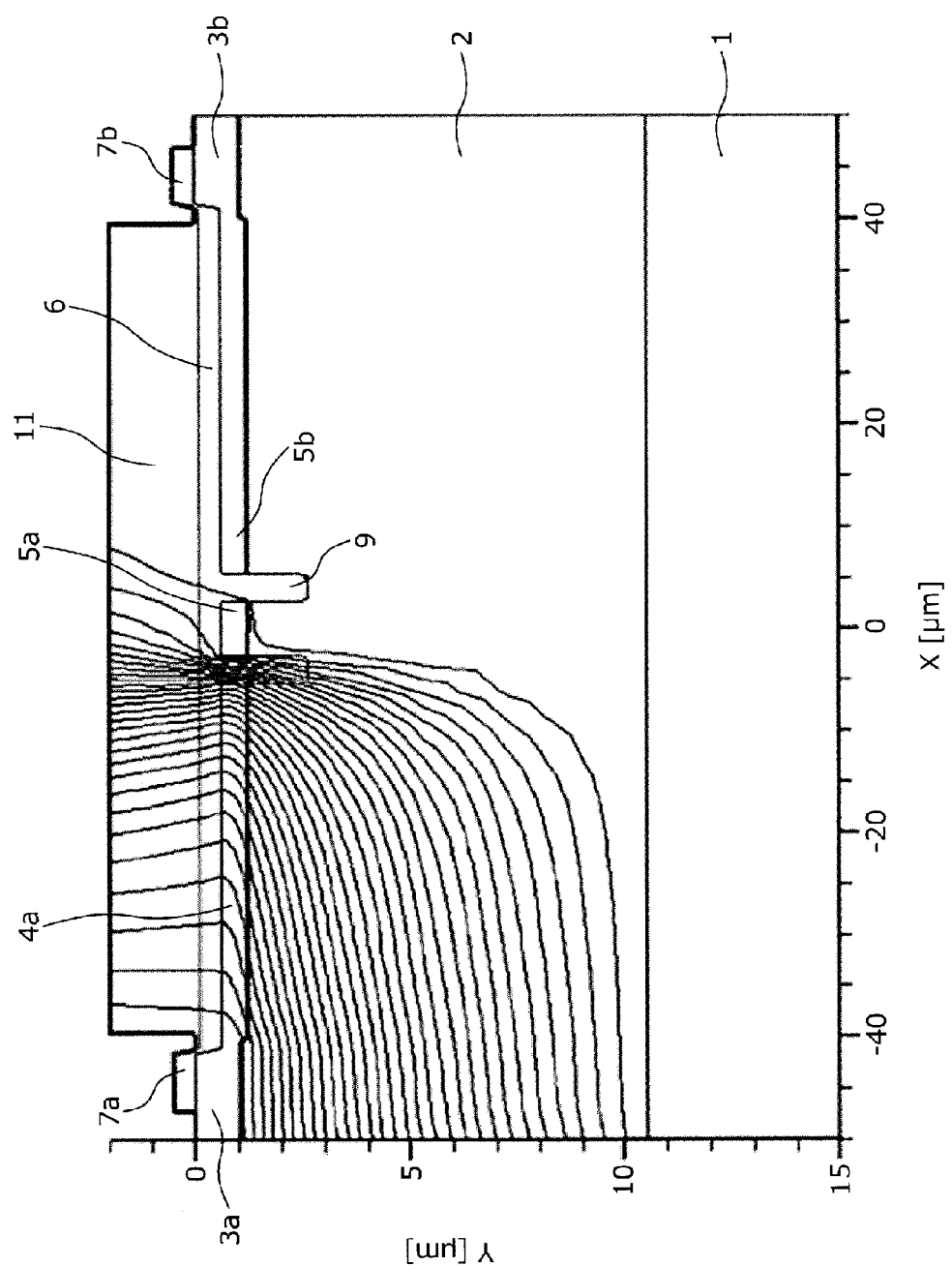
FIG. 19 illustrates the electrostatic potential distribution in a semiconductor device in Working Example 3.
Figure 20:
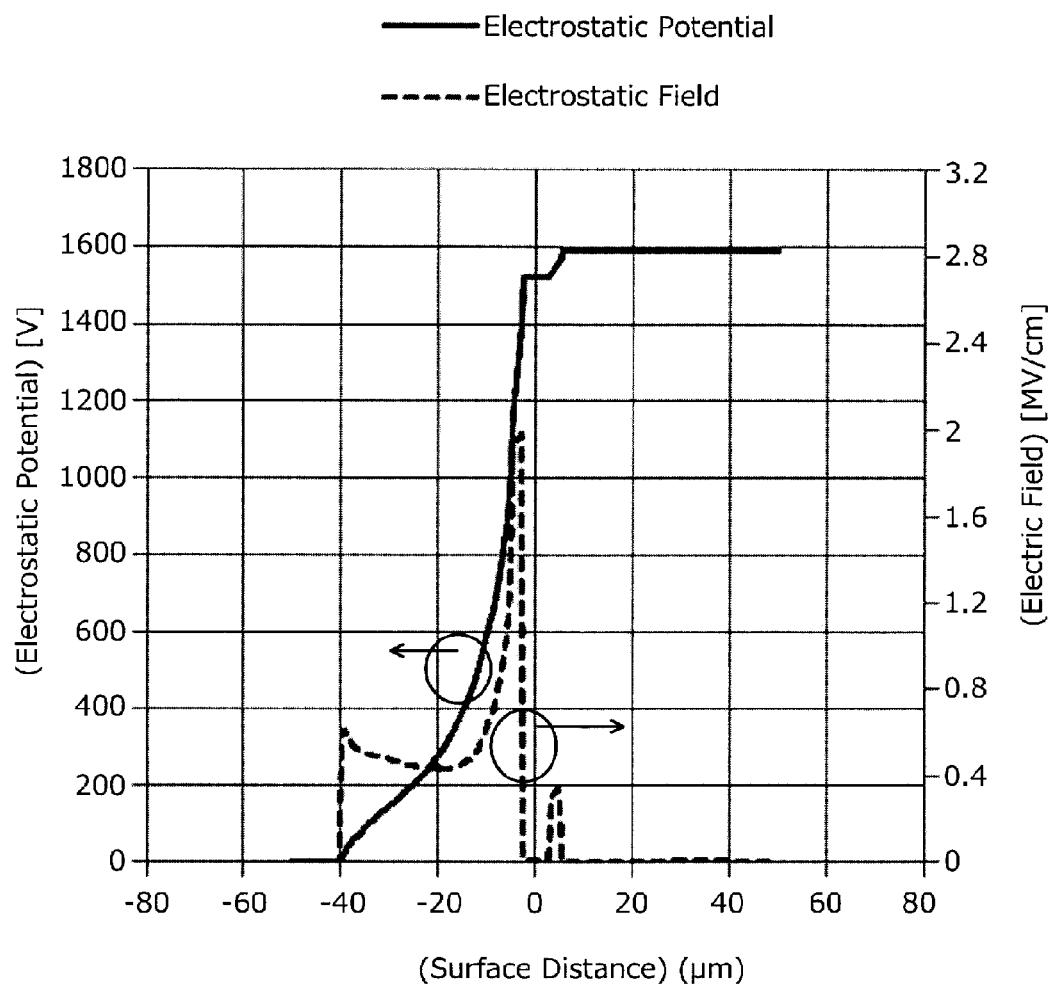
FIG. 20 is a graph showing the electrostatic potential distribution and the electric field strength distribution in a semiconductor device in Working Example 3.

Meanwhile, FIG. 19 shows the electrostatic potential distribution in Working Example 3 of the present invention (where the width W of the first trench 5a was set to 2.8 μm and the charge Qss at the interface between the interlayer insulating film 6 and the passivation film 11 was set to a value of $1.0 \times 10^{10}$/cm²). Moreover, FIG. 20 shows the electrostatic potential (left vertical axis) and the electric field strength (right vertical axis) at a position 0.1 μm below the interface between the interlayer insulating film 6 and the silicon carbide semiconductor portion of the device. FIG. 19 illustrates the electrostatic potential distribution in the semiconductor device in Working Example 3. FIG. 20 is a graph showing the electrostatic potential distribution and the electric field strength distribution in the semiconductor device in Working Example 3.

On the horizontal axis in FIG. 20, 0 μm is the position at the center of the structure (that is, at the center of the third p-type JTE region 4c), the negative values indicate positions on the MOSFET device 101a side of the center of the isolation structure 100c, and the positive values indicate positions on the MOSFET device 101b side of the center of the isolation structure 100c. FIG. 20 shows a case in which the electrostatic potential of the source electrode 7b of the MOSFET device 101b is higher than the electrostatic potential of the source electrode 7a of the MOSFET device 101a. Because the electrostatic potential of the source electrode 7b of the MOSFET device 101b is higher than the electrostatic potential of the source electrode 7a of the MOSFET device 101a, the withstand voltage is divided between the first p-type JTE region 4a, the first and second trenches 5a and 5b that are filled with the insulating layer 9 (or only one of the first and second trenches 5a and 5b), and the third p-type JTE region 4c.

The results shown in FIGS. 19 and 20 indicate that in Working Example 3, the electric field was strongest in the first trench 5a, and that the first p-type JTE region 4a was subjected to a voltage of approximately 1050V (66% or more of the withstand voltage), which is higher than in the conventional example. The reason that the withstand voltage of the isolation structure 100c in Working Example 3 was higher than the withstand voltage of the isolation structure in the conventional example is explained below. The first to third p-type JTE regions 4a to 4c are directly insulated and separated from one another by the first and second trenches 5a and 5b. Furthermore, the spatial distance between the interlayer insulating film 6 and the silicon carbide semiconductor portion of the device can be increased by a value equal to the depth of the first and second trenches 5a and 5b. This is advantageous because it reduces undesirable effects due to the presence of external electric charges at the interface between the passivation film 11 and the interlayer insulating film 6.

In addition, when the electrostatic potential of the source electrode 7a of the MOSFET device 101a is higher than the electrostatic potential of the source electrode 7b of the MOSFET device 101b, the withstand voltage is divided between the second p-type JTE region 4b, the first and second trenches 5a and 5b that are filled with the insulating layer 9 (or only one of the first and second trenches 5a and 5b), and the third p-type JTE region 4c. The electrostatic potential distributions shown for the conventional example and Working Example 3 in FIGS. 18 and 20, respectively, are only examples. These electrostatic potential distributions can be easily adjusted by changing the concentration of impurities in the first p-type JTE regions 144a and 4a.

According to the results above, in at least one aspect of the present invention, the length L1 of the isolation structure 100c can be made shorter than in the conventional example, and a higher withstand voltage can be achieved in the isolation structure 100c than in the conventional example. In at least one aspect of the present invention, the length L1 of the isolation structure 100c (that is, the distance from the p$^+$ well region 3a-side edge of the interlayer insulating film 6 to the p$^+$ well region 3b-side edge of the interlayer insulating film 6) is 80 μm. Meanwhile, in the conventional example the length L11 of the isolation structure is 120 μm (L11=2×L10=2×(Lp+Ln)). Therefore, in at least one aspect of the present invention, the length L1 of the isolation structure 100c can be made 40 μm shorter than the length of the isolation structure in the conventional example.

Figure 31:
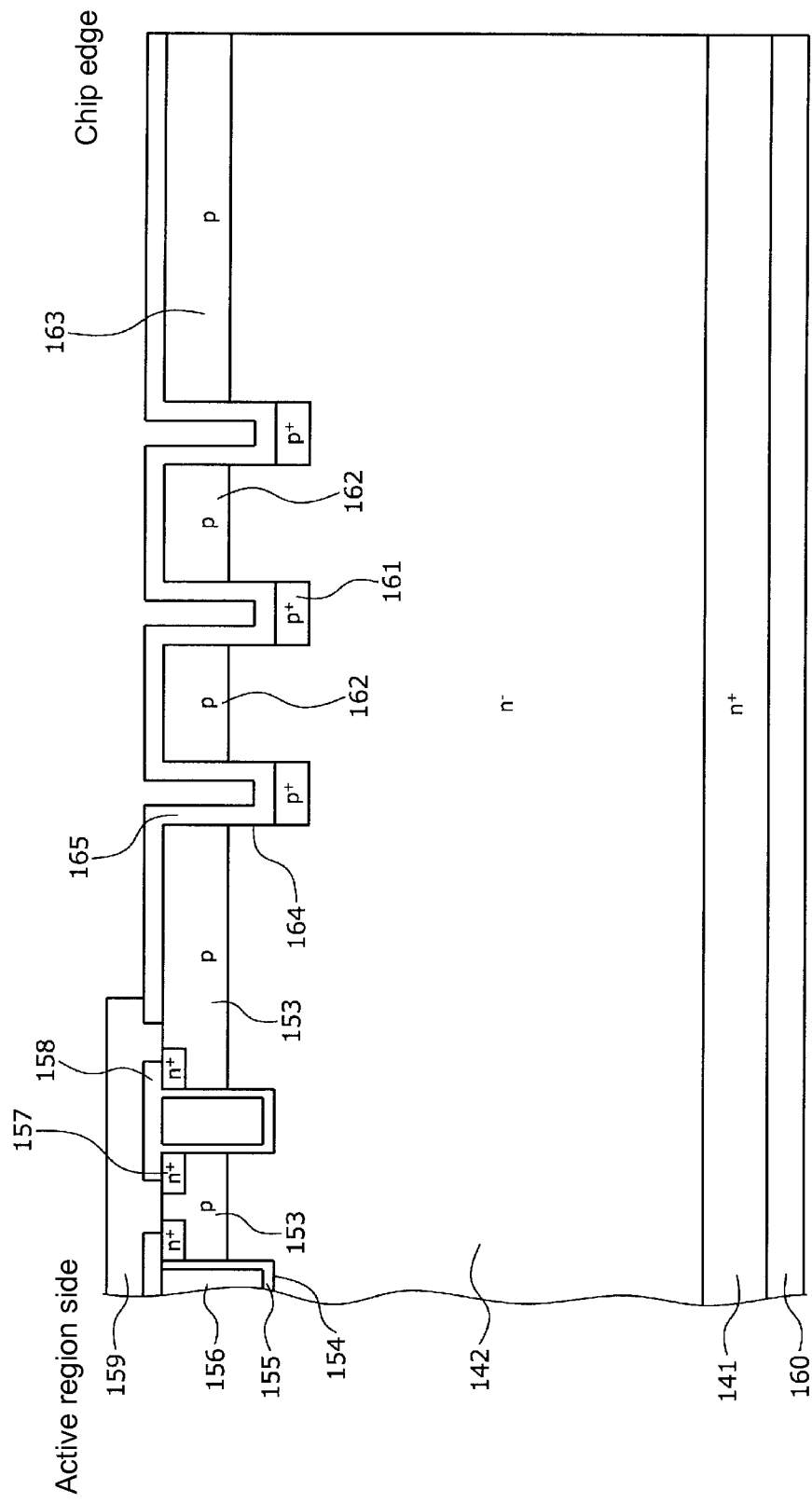
FIG. 31 is a cross-sectional view of another example of an edge termination structure in a conventional semiconductor device.
Figure 32:
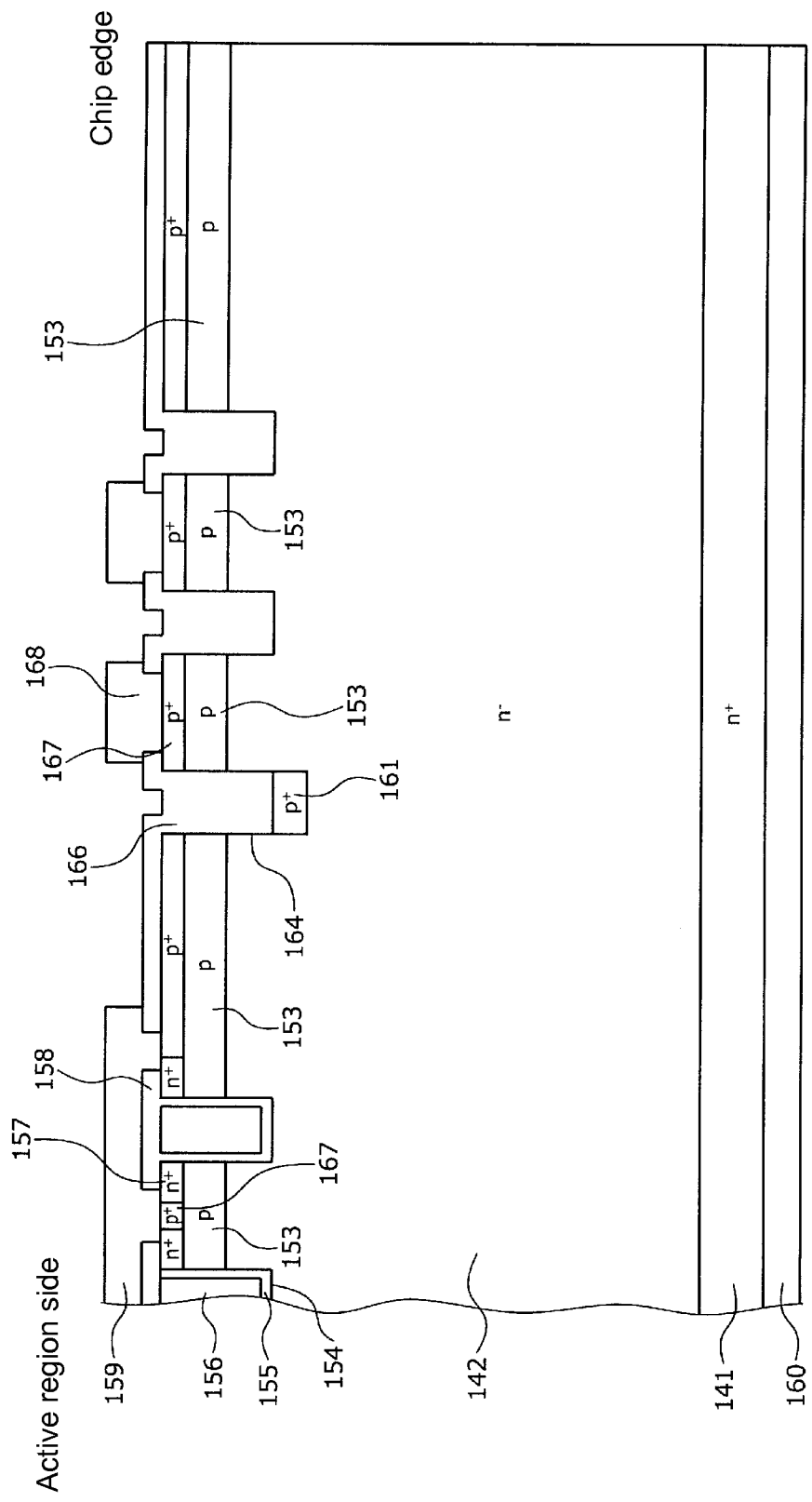
FIG. 32 is a cross-sectional view of another example of an edge termination structure in a conventional semiconductor device.

As described above, in comparison with an isolation structure made using a termination structure as employed in the conventional bidirectional devices shown in FIGS. 30 to 32, in Embodiment 1 the length of the isolation structure can be shortened by a value equal to the combined lengths of the n$^+$ channel-stop region and the portion of the n$^-$ drift layer between the n$^+$ channel-stop region and the p-type JTE region, which are not required in the isolation structure of Embodiment 1. Therefore, the length (width) of the isolation structure that electrically isolates two semiconductor elements formed on the same semiconductor substrate can be shortened, thereby facilitating miniaturization of the overall semiconductor device. Moreover, in comparison with isolation structures made using conventional field limiting ring structures, in Embodiment 1 the withstand voltage is divided between the p-type regions of the edge termination structure that are connected to the active region. Furthermore, because the withstand voltage is divided between the first to third p-type JTE regions and the first and second trenches, the dimensions of the trenches can be smaller than in conventional semiconductor devices such as the one shown in FIG. 33, for example, thereby improving manufacturability of the trenches. For the reasons described above, the length of the isolation structure in Embodiment 1 can be made shorter than that of isolation structures formed simply by using conventional edge termination structures. Therefore, because the dimensions of the isolation structure can be reduced when forming two elements monolithically on the same semiconductor substrate, both the overall chip size and the area of the wiring layer on the insulating substrate can be reduced. This facilitates miniaturization of the module or individual package, thereby reducing costs. Moreover, miniaturizing the module or individual packages reduces the occurrence of parasitic effects (such as parasitic capacitance, parasitic inductance, and parasitic resistance) that occur between the wiring layers and the ceramic substrate of the insulating substrate. This reduces both noise and losses in power semiconductor devices equipped with such a bidirectional device.

Embodiment 2

Figure 21:
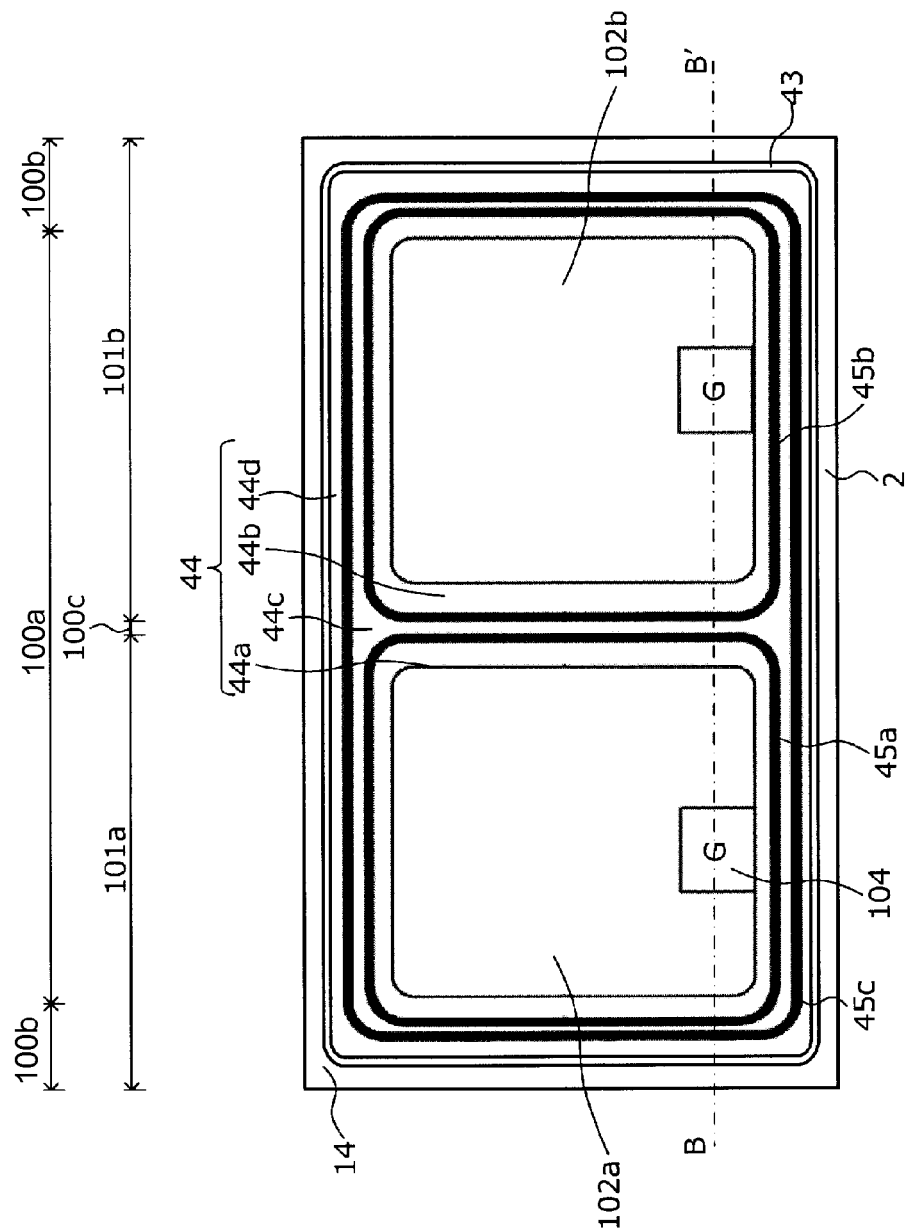
FIG. 21 is a plan view illustrating a semiconductor chip mounted on an insulating substrate from the top side (that is, the case lid side).
Figure 22:
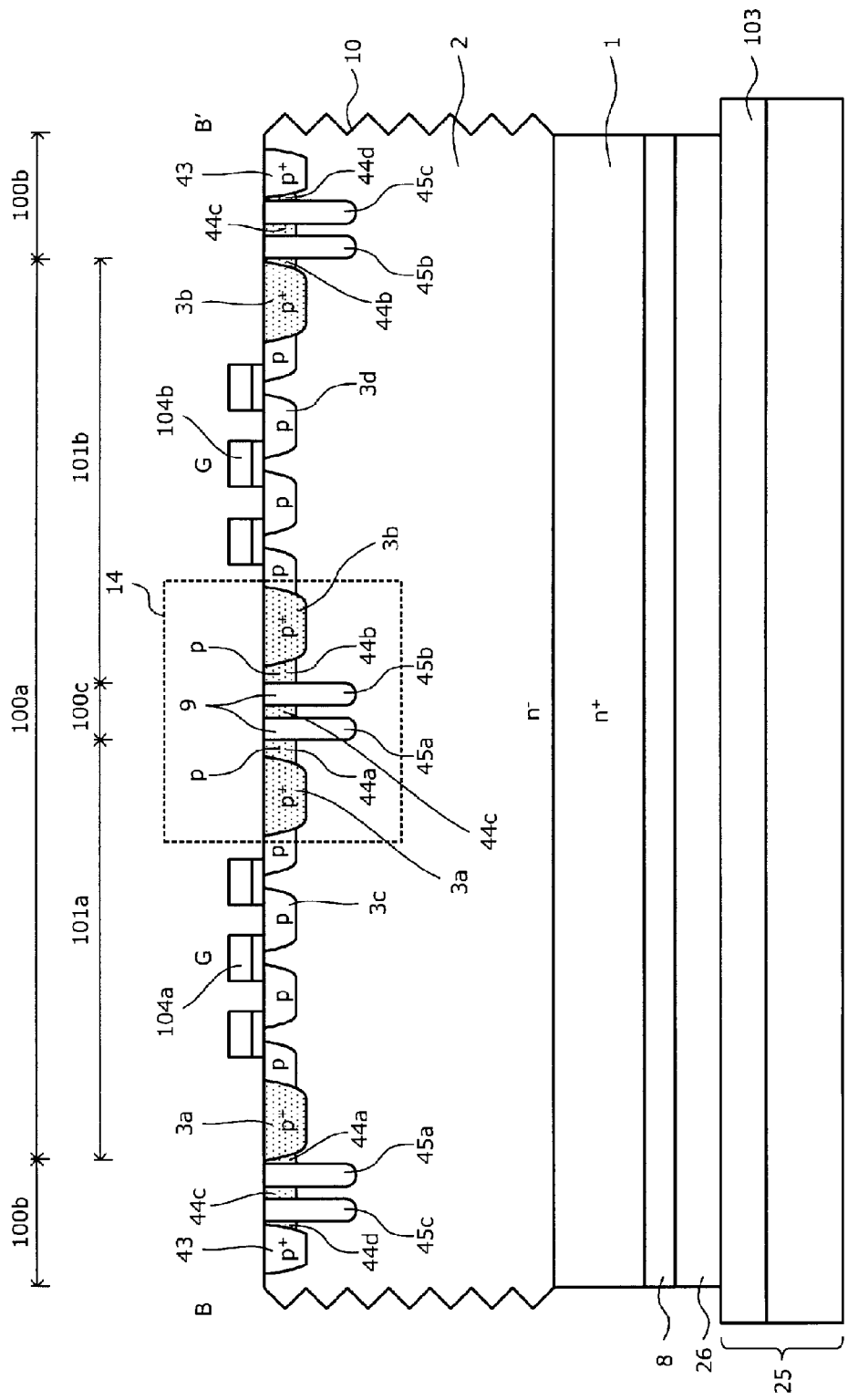
FIG. 22 is a cross-sectional view of a cross section taken along line B-B' in FIG. 21.

Next, the structure of a semiconductor device according to Embodiment 2 will be described. FIG. 21 is a plan view illustrating a semiconductor chip mounted on an insulating substrate from the top side (that is, the case lid side). FIG. 22 is a cross-sectional view of a cross section taken along line B-B' in FIG. 21. The semiconductor device according to Embodiment 2 is different from the semiconductor device according to Embodiment 1 in that an isolation structure 100c is also applied to an edge termination structure 100b. In other words, in Embodiment 2 a p-type JTE region 44 of the edge termination structure 100b is divided into different regions using trenches. In Embodiment 2, the configuration within the package case is the same as in Embodiment 1.

First, the planar structure of the semiconductor device according to Embodiment 2 will be described. As shown in FIG. 21, a p$^+$ channel-stop region 43 that has a substantially rectangular ring-shaped planar shape that encloses the center of the chip is formed around the periphery of the chip. A p-type JTE region 44 is formed on the inner side of the p$^+$ channel-stop region 43 and contacts the p$^+$ channel-stop region 43. The portion of the chip between the p$^+$ channel-stop region 43 and the p-type JTE region 44 is part of an n$^-$ drift layer 2. A third trench 45c that surrounds the periphery of an active region 100a within the p-type JTE region 44 is formed in the p-type JTE region 44. The third trench 45c divides the p-type JTE region 44 into a chip center-side portion (that is, an active region 100a-side portion) and a chip periphery-side portion 44d (a fourth p-type JTE region).

Furthermore, a first trench 45a and a second trench 45b are formed in the p-type JTE region 44 on the inner side of the third trench 45c. The first trench 45a surrounds the periphery of the portion of the chip in which the front surface structure of a MOSFET device 101a is arranged, and the second trench 45b surrounds the periphery of the portion of the chip in which the front surface structure of a MOSFET device 101b is arranged. In other words, the p-type JTE region 44 is divided into four regions (first to fourth p-type JTE regions 44a to 44d) by the first to third trenches 45a to 45c. The first p-type JTE region 44a is the portion of the p-type JTE region 44 enclosed by the first trench 45a. The second p-type JTE region 44b is the portion of the p-type JTE region 44 enclosed by the second trench 45b. The third p-type JTE region 44c is the portion of the p-type JTE region 44 between the third trench 45c and the first and second trenches 45a and 45b. The first to third trenches 45a to 45c each have a substantially rectangular ring-shaped planar shape, for example. The width W11 of the portion where the first and second trenches 45a and 45b are closest to one another is equal to the width W12a of the portion where the first and third trenches 45a and 45c are closest to one another as well as to the width W12b of the portion where the second and third trenches 45b and 45c are closest to one another.

The edge termination structure 100b includes the p$^+$ channel-stop region 43, the third and fourth p-type JTE regions 44c and 44d, the first to third trenches 45a to 45c, and the portion of the n$^-$ drift layer 2 between the p$^+$ channel-stop region 43 and the fourth p-type JTE region 44d. As in Embodiment 1, the isolation structure 100c includes the portions of the p-type JTE region 44 between the MOSFET devices 101a and 101b (the first to third p-type JTE regions 44a to 44c) as well the first and second trenches 45a and 45b formed between the MOSFET devices 101a and 101b. Moreover, the portions of the first and second p-type JTE regions 44a and 44b that are part of the isolation structure 100c (that is, the portions of the first and second p-type JTE regions 44a and 44b sandwiched between the MOSFET devices 101a and 101b) each have a width that can withstand at least 60%, for example, of the maximum breakdown voltage the device can withstand in its OFF state. The reason for giving these portions of the first and second p-type JTE regions 44a and 44b a width that can withstand at least 60%, for example, of the maximum breakdown voltage the device can withstand in its OFF state is the same as in Embodiment 1.

Next, the cross-sectional structure of the semiconductor device according to Embodiment 2 will be described. As shown in FIG. 22, the p+ channel-stop region 43 is selectively formed in the surface layer on the front surface of the n− drift layer 2 (that is, the surface opposite to the n+ semiconductor substrate 1 side) in the edge termination structure 100b region. The p+ channel-stop region 43 is formed on the inner side of the scribe region that runs around the periphery of the chip. Moreover, the p-type JTE region 44 is selectively formed in the surface layer on the front surface of the n− drift layer 2 (that is, the surface opposite to the n+ semiconductor substrate 1 side) in the edge termination structure 100b region. The p-type JTE region 44 is formed on the inner side of the p+ channel-stop region 43 and contacts the p+ channel-stop region 43. The front surface structures of the MOSFET devices 101a and 101b are formed separated from one another in the n− drift layer 2 in the active region 100a within the p-type JTE region 44. The front surface structures of the MOSFET devices 101a and 101b are surrounded, respectively, by the first and second p-type JTE regions 44a and 44b of the p-type JTE region 44.

The portion of the p-type JTE region 44 formed in the edge termination structure 100b region is divided into a plurality of regions by the first to third trenches 45a to 45c that go through the entire p-type JTE region 44 in the thickness direction thereof and extend down into the n− drift layer 2. More specifically, in the MOSFET device 101a side of the edge termination structure 100b, the p-type JTE region 44 is divided by the first and third trenches 45a and 45c into: the first p-type JTE region 44a between a p+ well region 3a and the first trench 45a; the third p-type JTE region 44c between the first and third trenches 45a and 45c; and the fourth p-type JTE region 44d between the p+ channel-stop region 43 and the third trench 45c. In the MOSFET device 101b side of the edge termination structure 100b, the p-type JTE region 44 is divided by the second and third trenches 45b and 45c into: the second p-type JTE region 44b between a p+ well region 3b and the second trench 45b; the third p-type JTE region 44c between the second and third trenches 45b and 45c; and the fourth p-type JTE region 44d between the p+ channel-stop region 43 and the third trench 45c.

In the isolation structure 100c, the cross-sectional structures of the first to third p-type JTE regions 44a to 44c and the first and second trenches 45a and 45b are the same, respectively, as the first to third p-type JTE regions and the first and second trenches in Embodiment 1. Therefore, as in Embodiment 1, in Embodiment 2 the length (width) of the isolation structure 100c can be made shorter than a conventional isolation structure. Moreover, when the same dimensions of each portion and the same concentration of impurities used in the isolation structure are used for the dimensions of each portion and the concentration of impurities in the edge termination structure 100b, the distance L20 between the p+ channel-stop region 43 and the active region 100a can be represented by formula (1). In formula (1), Lp is the distance from the structure center-side edge of the first trench 45a (that is, the interface between the first p-type JTE region 44a and the first trench 45a) to the p+ well region 3a-side edge of an interlayer insulating film 6 that covers the first p-type JTE region 44a. Lc is the distance from the center of the first trench 45a to the center of the structure (that is, the center of the third p-type JTE region 44c). W is the width of the first trench 45a.

$$L20 = Lp + 2 \times Lc + W \quad (1)$$

Using the dimensions from Embodiment 1, formula (1) yields a distance L20 of 45 μm from the p+ channel-stop region 43 to the active region 100a in Embodiment 2. Meanwhile, in the conventional example shown in FIG. 30, the distance L10 from the n+ channel-stop region 145 to the active region is 60 μm (L10=Lp+Ln). Therefore, in Embodiment 2 the length L20 of the isolation structure 100c can be made 15 μm shorter than the length of the isolation structure in the conventional example. Moreover, in comparison with the conventional example, in Embodiment 2 the size of the overall chip can be reduced by 70 μm in the direction in which the MOSFET devices 101a and 101b are arranged and by 30 μm in the direction orthogonal to the direction in which the MOSFET devices 101a and 101b are arranged.

As described above, and like Embodiment 1, Embodiment 2 achieves a number of advantageous effects. Furthermore, Embodiment 2 achieves further miniaturization of the overall chip by applying the structure of the isolation structure to the edge termination structure.

A variety of modifications can be made to the present invention as described in the embodiments above. The dimensions used for each portion of the device, the concentration of impurities used in each region, or the like can be configured as necessary to meet design requirements or the like. For example, in the embodiments above the JTE structure is described as having a single p-type JTE region as an example, but a multi-zone JTE structure in which a plurality of p-type JTE regions are formed and each have a lower concentration of impurities the farther each p-type JTE region is from the front surface structure of the MOSFET device may be used, or a variation of lateral doping (VLD) type structure in which the concentration of impurities in the drift region is varied in the lateral direction (that is, the direction parallel to the main substrate surface) in the edge termination structure may be used. Moreover, in each of the abovementioned embodiments the bidirectional device is described as having the drain terminals of two MOSFET devices being electrically connected as an example, but the abovementioned embodiments may also be applied to bidirectional devices in which the source terminals of two MOSFET devices are electrically connected.

Furthermore, in each of the abovementioned embodiments an epitaxial substrate in which an epitaxial layer that serves as an n− drift layer is formed on a semiconductor substrate is used as an example, but the n− drift layer may also be a diffusion region formed on the semiconductor substrate using an ion implantation process. In addition, in each of the abovementioned embodiments the semiconductor device was a device in the 1200V withstand voltage class as an example, but the embodiments may also be applied to devices in other withstand voltage classes by modifying the dimensions used for each portion of the device, the concentration of impurities used in each region, or the like in order to meet design requirements or the like. Moreover, in each of the abovementioned embodiments silicon carbide was used for the semiconductor material as an example, but the present invention is not limited to this example and may also be applied to cases in which other semiconductor materials such as gallium nitride (GaN), a gallium nitride-based compound, or silicon are used. Additionally, in each of the abovementioned embodiments the first conductivity type was the n-type and the second conductivity type was the p-type, but the present invention exhibits all of the same abovementioned advantageous effects if the first conductivity type is the p-type and the second conductivity type is the n-type.

INDUSTRIAL APPLICABILITY

As described above, the semiconductor device and the method for manufacturing the semiconductor device of the present invention are suitable for application to power semiconductor devices in which two elements are formed monolithically on the same semiconductor substrate.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate of a first conductivity type;
   a first semiconductor element having a front surface structure in a main surface of the semiconductor substrate;
   a second semiconductor element having a front surface structure in the main surface of the semiconductor substrate, the front surface structure of the second semiconductor element being separated from the front surface structure of the first semiconductor element;
   a rear surface electrode for the first and second semiconductor elements;
   a first semiconductor region of a second conductivity type selectively formed in the main surface of the semiconductor substrate so as to be between the front surface structure of the first semiconductor element and the front surface structure of the second semiconductor element and so as to surround the front surface structure of the first semiconductor element and the front surface structure of the second semiconductor element;
   a second semiconductor region of the first conductivity type formed in the main surface of the semiconductor substrate outside the first semiconductor region and separated therefrom; and
   at least one trench filled with an insulating layer in the first semiconductor region between the first semiconductor element and the second semiconductor element, respective ends of the at least one trench extending parallel to the main surface out of the first semiconductor region into the second semiconductor region so as to divide the first semiconductor region into a first semiconductor element side and a second semiconductor element side, thereby forming an isolation structure that includes the first semiconductor region between the first semiconductor element and the second semiconductor element and the at least one trench filled with the insulating layer, electrically isolating the front surface structure of the first semiconductor element from the front surface structure of the second semiconductor element.

2. A semiconductor device, comprising:
   a semiconductor substrate of a first conductivity type;
   a first semiconductor element having a front surface structure in a main surface of the semiconductor substrate;
   a second semiconductor element having a front surface structure in the main surface of the semiconductor substrate, the front surface structure of the second semiconductor element being separated from the front surface structure of the first semiconductor element;
   a rear surface electrode for the first and second semiconductor elements;
   a first semiconductor region of a second conductivity type selectively formed in the main surface of the semiconductor substrate so as to be between the front surface structure of the first semiconductor element and the front surface structure of the second semiconductor element and so as to surround the front surface structure of the first semiconductor element and the front surface structure of the second semiconductor element;
   a second semiconductor region of the second conductivity type formed in the main surface of the semiconductor substrate outside the first semiconductor region and in contact therewith;
   a first trench filled with an insulating layer in the first semiconductor region, surrounding the front surface structure of the first semiconductor element;
   a second trench filled with an insulating layer in the first semiconductor region, surrounding the front surface structure of the second semiconductor element, the second trench being separated from the first trench;
   a third trench filled with an insulating layer in the first semiconductor region, separated from the first and second trenches and surrounding the first and second trenches so as to divide the first semiconductor region into an inner side and an outer side, thereby forming an isolation structure that includes the first and second trenches and the first semiconductor region between the first semiconductor element and the second semiconductor element, electrically isolating the front surface structure of the first semiconductor element from the front surface structure of the second semiconductor element.

3. The semiconductor device according to claim 2, wherein a width of a portion where the first and third trenches are closest to one another is equal to a width of a portion where the first and second trenches are closest to one another.

4. The semiconductor device according to claim 2, wherein a width of a portion where the second and third trenches are closest to one another is equal to a width of a portion where the first and second trenches are closest to one another.

5. The semiconductor device according to claim 1, wherein a portion of the first semiconductor region that is between the first semiconductor element and the second semiconductor element has a width that withstands at least 60% of a guaranteed maximum breakdown voltage, said portion of the first semiconductor region being completely depleted when the breakdown voltage is reached.

6. The semiconductor device according to claim 2, wherein a portion of the first semiconductor region that is between the first semiconductor element and the second semiconductor element has a width that withstands at least 60% of a guaranteed maximum breakdown voltage, said portion of the first semiconductor region being completely depleted when the breakdown voltage is reached.

7. The semiconductor device according to claim 1, wherein portions of the first semiconductor region located between outer sides of the front surface structure of the first semiconductor element and the second semiconductor region and located between outer sides of the front surface structure of the second semiconductor element and the second semiconductor region form termination structures.

8. The semiconductor device according to claim 2, wherein portions of the first semiconductor region located between outer sides of the front surface structure of the first semiconductor element and the second semiconductor region and located between outer sides of the front surface structure of the second semiconductor element and the second semiconductor region form termination structures.

9. The semiconductor device according to claim 1,
   wherein the front surface structure of the first semiconductor element further includes a third semiconductor region of the second conductivity type in the main surface of the semiconductor substrate, the third semiconductor region being in contact with the first semiconductor region and having a higher concentration of impurities than the first semiconductor region, and wherein the front surface structure of the second semiconductor element further includes a fourth semiconductor region of the second conductivity type in the main surface of the semiconductor substrate, the fourth semiconductor region being in contact with the first semiconductor region and having a higher concentration of impurities than the first semiconductor region, wherein the semiconductor device further includes:

an interlayer insulating film formed on at least a portion of the third semiconductor region, on at least a portion of the first semiconductor region, and on at least a portion of the fourth semiconductor region;

a first input electrode in contact with the third semiconductor region and an adjacent portion of the first semiconductor region, the first input electrode extending over a portion of the interlayer insulating film;

a second input electrode in contact with the fourth semiconductor region and an adjacent portion of the first semiconductor region, the second input electrode extending over a portion of the interlayer insulating film;

a semiconductor layer of the first conductivity type formed on another main surface of the semiconductor substrate, the semiconductor layer having a higher concentration of impurities than the semiconductor substrate; and a rear surface electrode in contact with the semiconductor layer.

10. The semiconductor device according to claim 2, wherein the front surface structure of the first semiconductor element further includes a third semiconductor region of the second conductivity type in the main surface of the semiconductor substrate, the third semiconductor region being in contact with the first semiconductor region and having a higher concentration of impurities than the first semiconductor region, and wherein the front surface structure of the second semiconductor element further includes a fourth semiconductor region of the second conductivity type in the main surface of the semiconductor substrate, the fourth semiconductor region being in contact with the first semiconductor region and having a higher concentration of impurities than the first semiconductor region, wherein the semiconductor device further includes:

an interlayer insulating film formed on at least a portion of the third semiconductor region, on at least a portion of the first semiconductor region, and on at least a portion of the fourth semiconductor region;

a first input electrode in contact with the third semiconductor region and an adjacent portion of the first semiconductor region, the first input electrode extending over a portion of the interlayer insulating film;

a second input electrode in contact with the fourth semiconductor region and an adjacent portion of the first semiconductor region, the second input electrode extending over a portion of the interlayer insulating film;

a semiconductor layer of the first conductivity type formed on another main surface of the semiconductor substrate, the semiconductor layer having a higher concentration of impurities than the semiconductor substrate; and a rear surface electrode in contact with the semiconductor layer.

11. The semiconductor device according to claim 1, wherein a depth of each of said at least one trench is greater than or equal to 1.75 μm and less than 5.0 μm.

12. The semiconductor device according to claim 1, wherein a width of each of said at least one trench is greater than or equal to 1.8 μm and less than 6.0 μm.

13. The semiconductor device according to claim 1, wherein silicon carbide, gallium nitride, a gallium nitride-based compound, or silicon is used as a semiconductor material of said semiconductor substrate.

14. The semiconductor device according to claim 2, wherein silicon carbide, gallium nitride, a gallium nitride-based compound, or silicon is used as a semiconductor material of said semiconductor substrate.

15. The semiconductor device according to claim 1,
wherein a four-layer hexagonal silicon carbide single crystal is used as a semiconductor material of said semiconductor substrate, and
wherein an impurity dosage of the first semiconductor region is $1.1 \times 10^{13}/cm^2$ to $1.75 \times 10^{13}/cm^2$.

16. The semiconductor device according to claim 2,
wherein a four-layer hexagonal silicon carbide single crystal is used as a semiconductor material of said semiconductor substrate, and
wherein an impurity dosage of the first semiconductor region is $1.1 \times 10^{13}/cm^2$ to $1.75 \times 10^{13}/cm^2$.

17. A method of manufacturing a semiconductor device, comprising:

forming a first semiconductor element and a second semiconductor element in a semiconductor substrate of a first conductivity type, the first semiconductor element having a front surface structure in a main surface of the semiconductor substrate, the second semiconductor element having a front surface structure in the main surface of the semiconductor substrate;

forming a rear surface electrode for the first and second semiconductor elements;

selectively forming a first semiconductor region of a second conductivity type in the main surface of the semiconductor substrate such that the first semiconductor region is located between the front surface structure of the first semiconductor element and the front surface structure of the second semiconductor element as well as surrounding the front surface structure of the first semiconductor element and the front surface structure of the second semiconductor element;

forming a second semiconductor region of the first conductivity type in the main surface of the semiconductor substrate outside the first semiconductor region and separated therefrom; and forming at least one trench filled with an insulating layer in the first semiconductor region between the first semiconductor element and the second semiconductor element, respective ends of the at least one trench extending parallel to the main surface out of the first semiconductor region into the second semiconductor region so as to divide the first semiconductor region into a first semiconductor element side and a second semiconductor element side, thereby forming an isolation structure that includes said at least one trench filled with the insulating layer and the first semiconductor region between the first semiconductor element and the second semiconductor element, electrically isolating the front surface structure of the first semiconductor element from the front surface structure of the second semiconductor element.

* * * * *